United States Patent [19]

Ohtani

[11] Patent Number: 5,691,665

[45] Date of Patent: Nov. 25, 1997

[54] PPM DEMODULATION DEVICE

[75] Inventor: Yoshihiro Ohtani, Souraku-gun, Japan

[73] Assignee: Sharp Kabushiki Kaisha, Osaka, Japan

[21] Appl. No.: 719,755

[22] Filed: Sep. 25, 1996

[30] Foreign Application Priority Data

Jun. 29, 1995 [JP] Japan .................................. 7-253061

[51] Int. Cl.⁶ .................................................. H03K 9/04
[52] U.S. Cl. ........................................ 329/313; 375/239
[58] Field of Search ................................ 329/313, 314; 375/239; 360/40, 48

[56] References Cited

U.S. PATENT DOCUMENTS 4,627,075  12/1986  Fleming, III et al. ............. 329/313 X

OTHER PUBLICATIONS

M. Shimizu, PPM Demodulation Circuit, Japanese Laid-Open Patent Publication #63-99621, Pub. Date Apr. 30, 1988. No 45.

*Primary Examiner*—David Mis
*Attorney, Agent, or Firm*—David G. Conlin; David D. Lowry

[57] ABSTRACT

A clock reproduction unit provides a reproduced clock signal from a received PPM signal. The results of sampling the PPM signal with a reproduced clock signal is held by a sample result holding unit. Symbol synchronization is achieved from a received PPM signal by a symbol synchronizing signal generation unit. According to the sample result, the reproduced clock signal, and symbol synchronization, a reception data reproduction unit analyzes the result of a plurality of previous samples to decode reception data according to a specific procedure.

7 Claims, 21 Drawing Sheets

PPM DEMODULATION DEVICE

BACKGROUND OF THE INVENTION

1. Field of the Invention

The present invention relates to PPM demodulation devices. More particularly, the present invention relates to a PPM demodulation device used in the field of optical communication for demodulating reception data that is subjected to pulse-position modulation (PPM) with a pulse signal inserted into a predetermined symbol position.

2. Description of the Background Art

The PPM system transmits information according to the pulse position. In general, 4-PPM, 16-PPM, and the like are preferably employed for the sake of convenience.

FIG. 18 shows an example of a modulation waveform of 4-PPM and 16-PPM. Referring to FIG. 18, information is transmitted for every 2 bits, not 1 bit, in the 4-PPM system. There are 4 possible combinations as the 2-bit information, i.e., 00, 01, 10, and 11. The information is converted into four types of pulse positions (0, 1, 2, 3) to be transmitted. Each of the four positions at which a pulse can be present is called a "pulse slot". The unit indicating the information of 2 bits formed of four pulse slots is referred to as "symbol".

In the modulation system of 16-PPM, 16 types of information (0000~1111) in four bits are converted into sixteen pulse positions 0~15 to be transmitted. In this case, each unit formed of 16 pulse slots is the "symbol".

There are various conventional demodulation methods for the modulation system of PPM. One of the most simple demodulation method is to regard a pulse as being present in a pulse slot position where an H level (logical high) is detected as a result of sampling with a reproduced clock in synchronization with a PPM pulse. This conventional demodulation method will be described in detail hereinafter.

FIG. 19 is a typical timing chart of such a conventional PPM demodulation device that achieves symbol synchronization. It is appreciated from FIG. 19 that a particular header portion is added and transmitted in a PPM signal to obtain synchronization. Here, a preamble portion for achieving pulse synchronization and a start flag portion for achieving symbol synchronization are added as a header before the PPM data portion. The start flag portion is indicated as a shaded region in FIG. 19. A PPM signal 21 that is received by a receiver and amplified has a waveform that is slightly distorted in comparison with the waveform of the PPM signal right after transmission. This is because the PPM waveform is distorted at the receiver end when a PPM signal is used in spatial transmission. The degree of waveform distortion depends upon the distance to be transmitted and the data rate. According to the time constant of components forming the receiver, the reception pulse is distorted in a direction where the pulse width becomes smaller when the transmission distance is great. When the transmission distance is short, the reception pulse is distorted in a direction where the pulse width becomes greater. Furthermore, it is considered that the rate of distortion is relatively increased when the data rate is high in comparison to the high frequency response rate of the device.

FIG. 19 shows the case where transmission is carried out over a small distance. The waveform is distorted so that the pulse width is extended. In FIG. 19, reception PPM signal 21 has the distorted portion shaded comparable to a transmission PPM waveform.

A PPM demodulation device generates a reproduced clock signal 22 from an externally received PPM signal 21. Reproduced clock signal 22 generally rises in the proximity of the center of a reception PPM pulse to provide the sampling timing of a reception PPM pulse. Reproduced clock signal 22 can be formed by a feedback circuit called a PLL. It is appreciated from FIG. 19 that reproduced clock signal 22 has its phase corrected so as to rise about the middle of the PPM pulse at the phase adjustment area (the shaded section).

Sample result 23 is obtained by sampling PPM signal 21 with reproduced clock signal 22. The PPM demodulation device demodulates the PPM data according to the information of reproduced clock signal 22 and sample result 23. As seen from FIG. 19, the PPM demodulator can effect demodulation properly when distortion of reception PPM signal 21 is not great since the waveform of sample result 23 after reproduced clock signal 22 attains a steady state is identical to the transmitted PPM waveform.

As described above, the PPM waveform is slightly distorted at the stage of amplifying the weak PPM signal received at the receiver end considering transmission using a PPM waveform in spatial transmission. The degree of distortion of the waveform differs according to the distance of transmission since there is a great difference in the input to the amplifier between a great distance and a small distance between the transmitter and receiver devices. In general, the pulse width of a PPM pulse becomes smaller when the distance of transmission is great and becomes larger when the distance of transmission is small. When a PPM pulse is extended greater than 1.5 times the normal width, sample result 23 will attain an H level at the original pulse slot and also at the adjacent pulse slot in sampling the PPM signal. In the case of transmission employing infrared rays, noise of a fluorescent lamp and the like is present in the vicinity of the low frequency range. Many reception amplify devices (amplifiers) are designed to effect amplification avoiding such low frequency ranges. This is also one cause of inducing distortion in the pulse.

FIGS. 20 and 21 show the case where the pulse width of a pulse is greatly extended. Referring to FIG. 20, a pulse is transmitted at the pulse slot position of 1 at symbol (B). At the reception end, sample result 23 attains an H level at both pulse slot positions corresponding to 1 and 2. Determination cannot be made whether 1 or 2 is transmitted.

At symbol (D), sample result 23 rises to an H level at the 0 pulse slot position since the pulse of the immediately preceding symbol (C) is extended. Determination cannot be made whether symbol (D) was 0 or 2 at the reception end.

Referring to FIG. 21, the sample result becomes identical at symbols (B) and (D) although the transmission waveform differ since each pulse width is extended. Determination cannot be made whether 0 is transmitted or 1 is transmitted at the reception end.

The conventional PPM demodulation device could not demodulate data properly in the above-described cases. Generation of a data error was accepted or that packet was discarded as a result of data error. In other words, the conventional PPM demodulation device have a problem that demodulation cannot be effected properly when a signal is applied in which the reception pulse width is greater than approximately 1.5 times the transmission pulse width. In contrast, a PPM signal reception amplify device (amplifier) connected to a conventional PPM demodulation device must be designed to avoid distortion of a PPM signal by adding a circuit such as an AGC so that the pulse width can be accommodated within a specification range in which the PPM demodulation device can carry out demodulation properly.

SUMMARY OF THE INVENTION

In view of the foregoing, a main object of the present invention is to provide a PPM demodulation device that can always effect demodulation properly even when a PPM signal is input having a reception pulse width extended as great as approximately two times the original pulse width.

According to an aspect of the present invention, a PPM demodulation device demodulates reception data that has its pulse position modulated with a pulse that varies between a first level and a second level inserted at a predetermined symbol position. A clock reproduction circuit provides a reproduced clock signal from the received pulse position modulated data. The pulse position modulated data is sampled according to the reproduced clock signal. The result thereof is held in a sample result holding circuit. A symbol synchronizing signal is generated from a symbol synchronizing signal generation circuit for achieving synchronization of the symbol position according to received data. When there is reception data attaining a second level at a plurality of pulse slot positions within the same symbol indicated by the symbol synchronizing signal out of the sampled data held in the sample result holding circuit, the pulse of the pulse slot position first attaining the second level in that symbol is made valid by a demodulation circuit.

In contrast to the conventional PPM demodulation device where there is a great possibility of error occurrence or reception failure when a received PPM signal has a pulse width extended greater than 1.5 times the original pulse width, the PPM demodulation device of the present invention can carry out demodulation properly even when a PPM signal is applied having a pulse width extended up to approximately two times the original pulse width. Furthermore, an amplifier or the like connected to the PPM demodulation device of the present invention has its restriction of an output pulse width relaxed in amplifying a pulse. Therefore, circuitry can be simplified without any complicated structure of an AGC or the like.

According to a preferable embodiment of the present invention, the demodulation circuit validates the pulse that is first detected as attaining the second level within a symbol when there are a plurality of reception data attaining the second level at continuous pulse slot positions in the same symbol.

According to a preferable embodiment of the present invention, when a pulse of a second level is detected at a plurality of pulse slot positions within the same symbol, the demodulation circuit determines all the pulse positions excluding the first pulse position in that symbol only when one of the plurality of pulse slot positions takes the first pulse slot position, and a pulse of the second level is also detected at an immediate preceding pulse position.

According to a preferable embodiment of the present invention, an edge detection circuit is further provided for detecting the leading edge of reception data between reproduced clock signals. In the case where a pulse of the second level is detected at a plurality of pulse slot positions in the same symbol, the demodulation circuit makes determination that a pulse exists at the first pulse slot in the symbol when two of the pulse attaining the second level takes the first and second pulse slot positions, and the second level is also detected at the last pulse position of an immediately preceding symbol, and when a leading edge is not detected by the edge detection circuit during sampling of the first and second pulse slots.

According to a preferable embodiment, a clock reproduction circuit receives a master clock signal generated from a clock generation circuit and generates a reproduced clock signal according to self-oscillation of an oscillation circuit. The phase of reception data is compared with that of a reproduced clock signal according to the master clock signal. According to the comparison output, the phase of the reproduced clock signal generated from the oscillation circuit is controlled.

In a preferable embodiment of the present invention, the sample result holding circuit includes a shift circuit for shifting reception signal while holding the same according to a reproduced clock signal from the clock reproduction circuit.

According to a more preferable embodiment of the present invention, the symbol synchronizing signal generation circuit has the reproduced clock signal counted by a counter circuit to provide a symbol synchronizing signal in response to determination of a match between a sample of reception data held in the sample result holding circuit and a predetermined pattern by a comparator circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
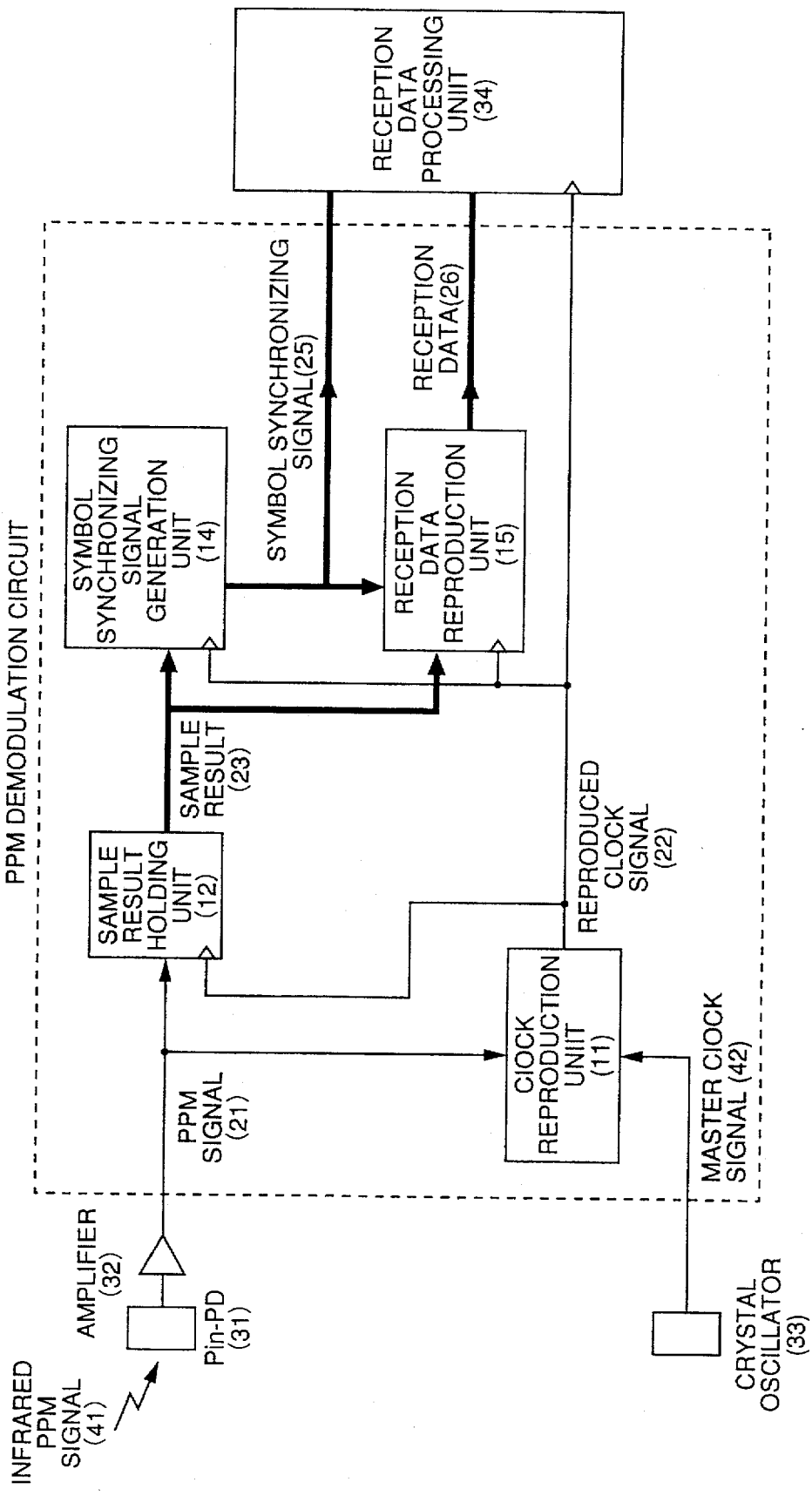
FIG. 1 is a block diagram showing an entire structure of a first embodiment of the present invention.

FIG. 1 is a block diagram showing an entire structure of first embodiment of the present invention. Referring to FIG.

1, an externally applied weak infrared PPM signal 41 is received at a Pin-PD31 and amplified by an amplifier 32 to result in a PPM signal 21 of a digital signal level. PPM signal 21 is applied to a clock reproduction unit 11 and a sample result holding unit 12. A master clock signal 42 of high frequency is applied to clock reproduction unit 11 from an external crystal oscillator 33. Clock reproduction unit 11 provides a reproduced clock signal 22 from received PPM signal 21 according to master clock signal 42. Reproduced clock signal 22 is applied to sample result holding unit 12, a symbol synchronizing signal generation unit 14, a reception data reproduction unit 15, and a reception data processing unit 34.

Sample result holding unit 12 samples PPM signal 21 according to reproduced clock signal 22 to hold a sample result 23. Sample result 23 is applied to symbol synchronizing signal generation unit 14 and reception data reproduction unit 15. Symbol synchronizing signal generation unit 14 achieves symbol synchronization from sample result 23 according to reproduced clock signal 22. The obtained symbol synchronizing signal 25 is applied to reception data reproduction unit 15 and reception data processing unit 34. Reception data reproduction unit 15 demodulates reception data according to sample result 23, symbol synchronizing signal 25, and reproduced clock signal 22. More specifically, reception data reproduction unit 15 analyzes the result of a plurality of previous samples from sample result 23 to demodulate reception data according to a specific procedure. Symbol synchronizing signal 25, demodulated data 26, and reproduced clock signal 22 are applied to reception data processing unit 34 to be processed.

Figure 2:
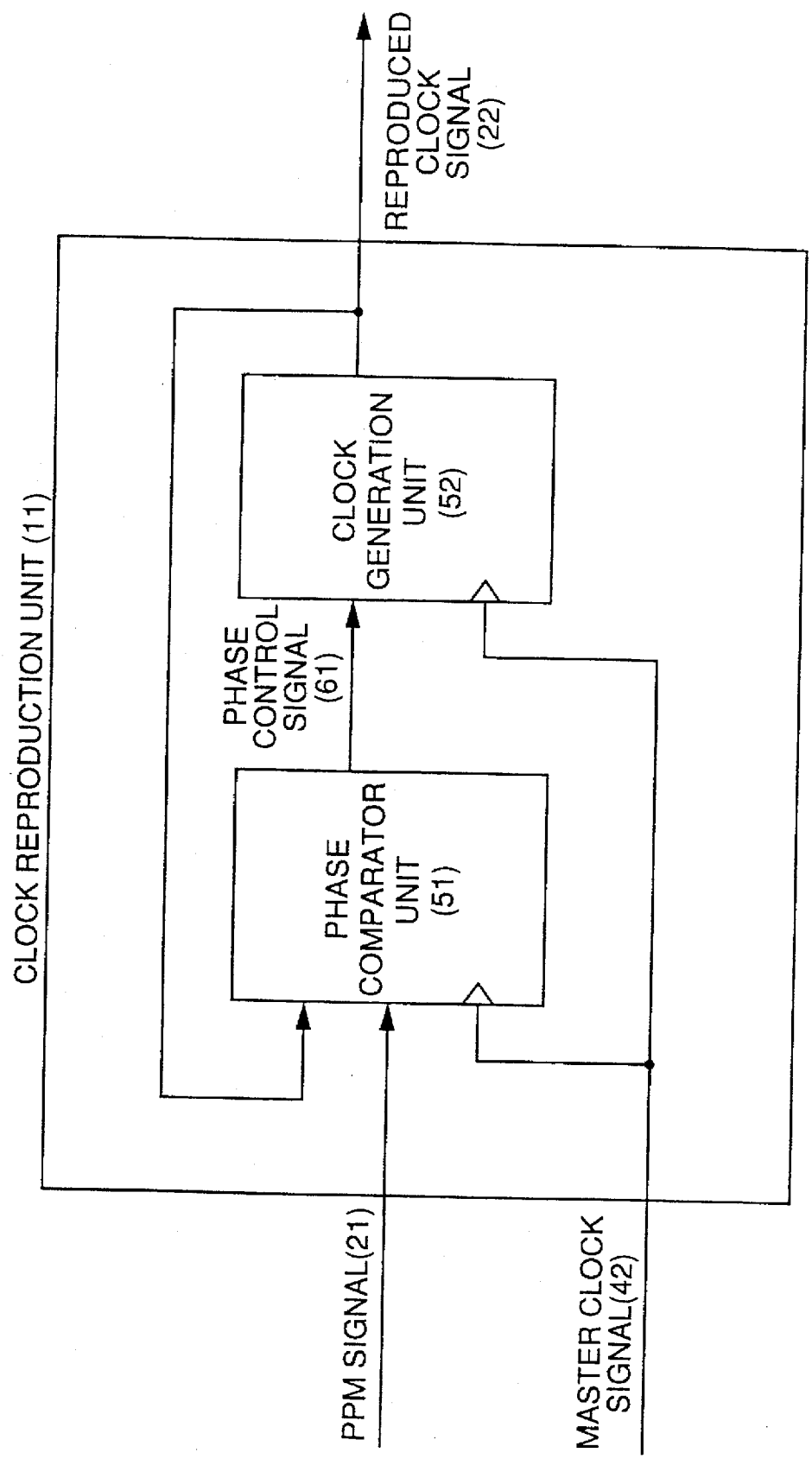
FIG. 2 shows a specific structure of a clock reproduction unit of FIG. 1.

FIG. 2 shows a specific structure of clock reproduction unit 11 shown in FIG. 1. Referring to FIG. 2, clock reproduction unit 11 includes a phase comparator unit 51 and a clock generation unit 52. Clock generation unit 52 generates reproduced clock signal 22 by self-oscillation. Reproduced clock signal 22 is applied to phase comparator unit 51. Phase comparator unit 51 compares the phases of PPM signal 21 and reproduced clock signal 22 according to master clock signal 42 to feed back a phase control signal 61 to clock generation unit 52. Clock generation unit 52 adjusts the phase of reproduced clock signal 22 by phase control signal 61. The frequency of master clock signal 42 is selected to be an integer multiple of the frequency of a desired reproduced clock signal 22. A finer phase control is allowed as this scale factor is increased. By selecting the scale factor to be approximately 8 times or 16 times, a reproduced clock signal 22 that rises substantially at the middle of the pulse of PPM signal 21 can be obtained.

Figure 3:
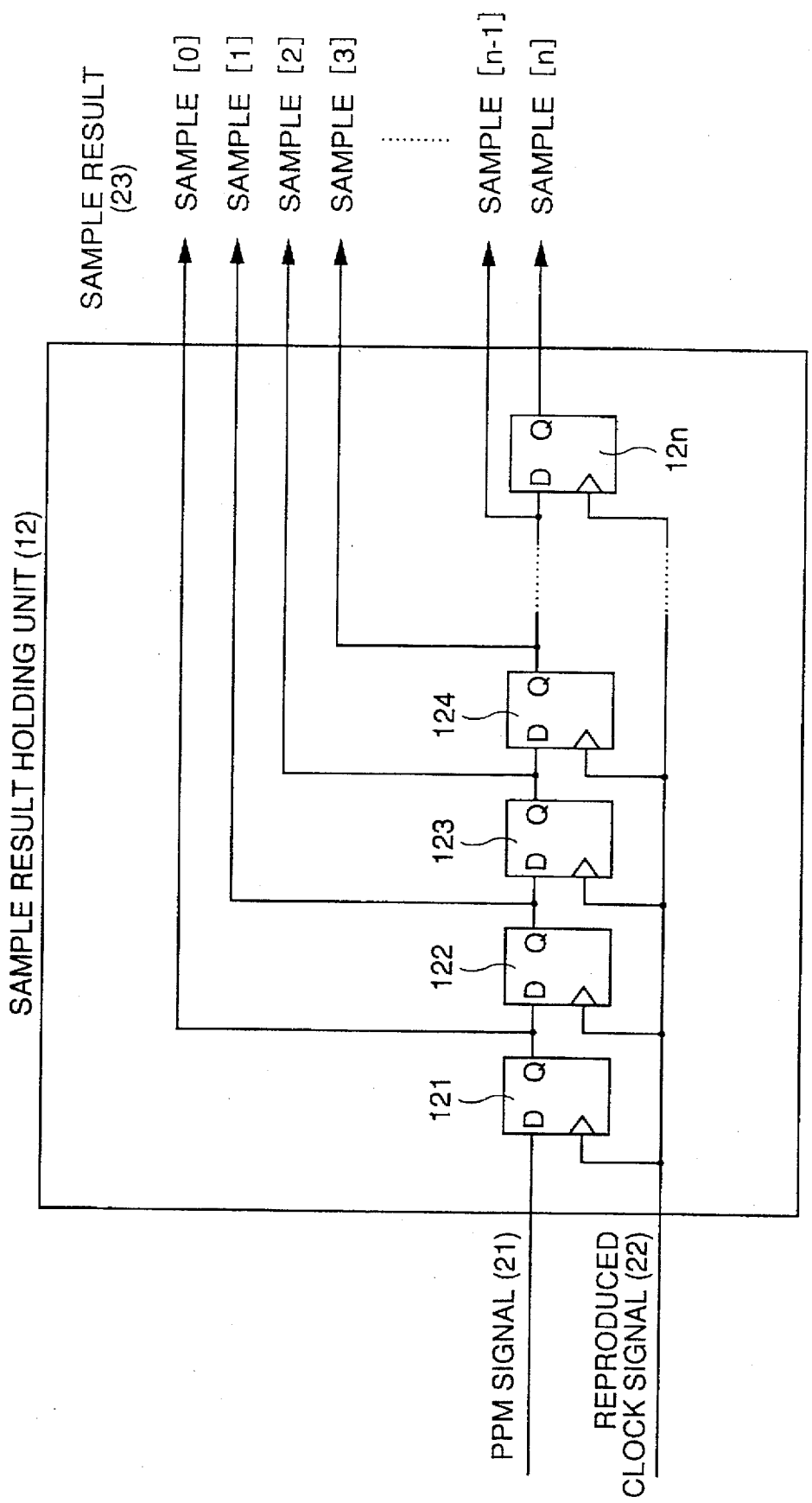
FIG. 3 shows a specific structure of a sample result holding unit of FIG. 1.
Figure 19:
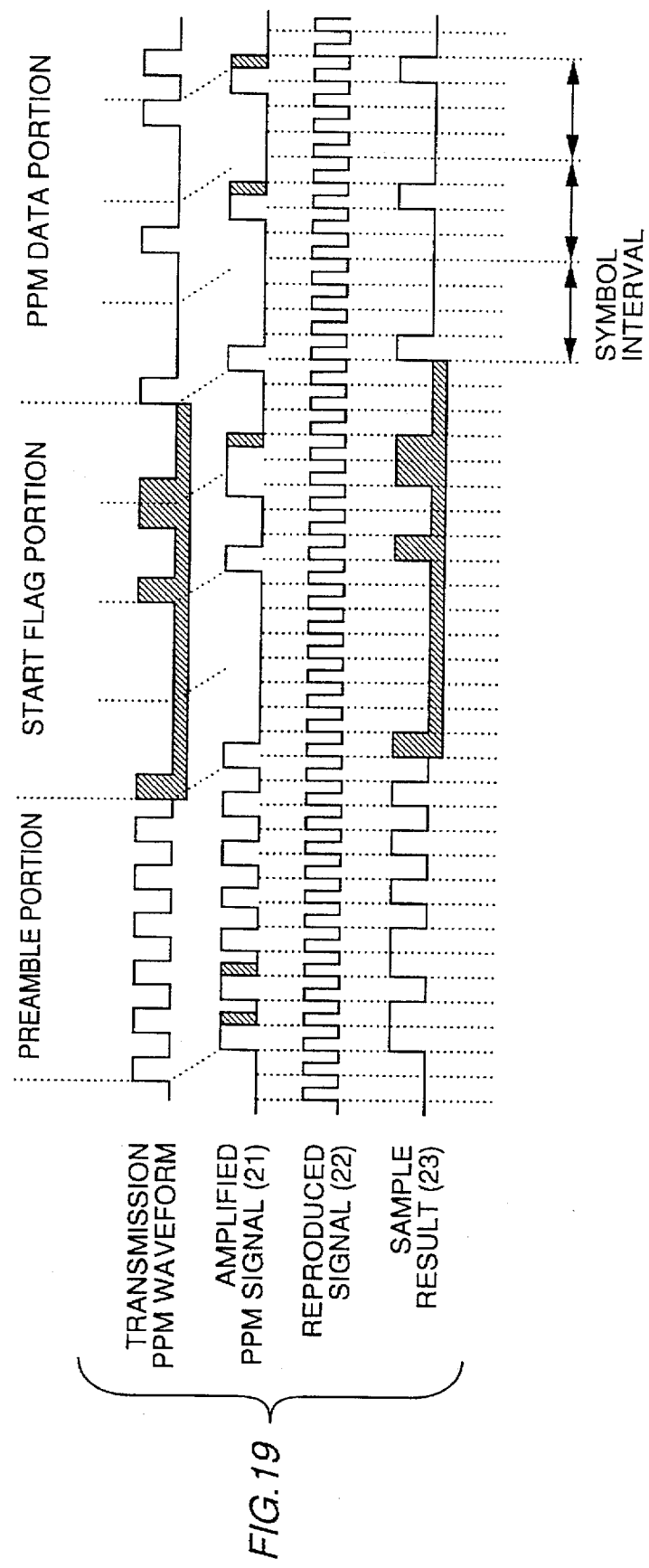
FIG. 19 is a timing chart of a conventional PPM demodulation device.
Figure 20:
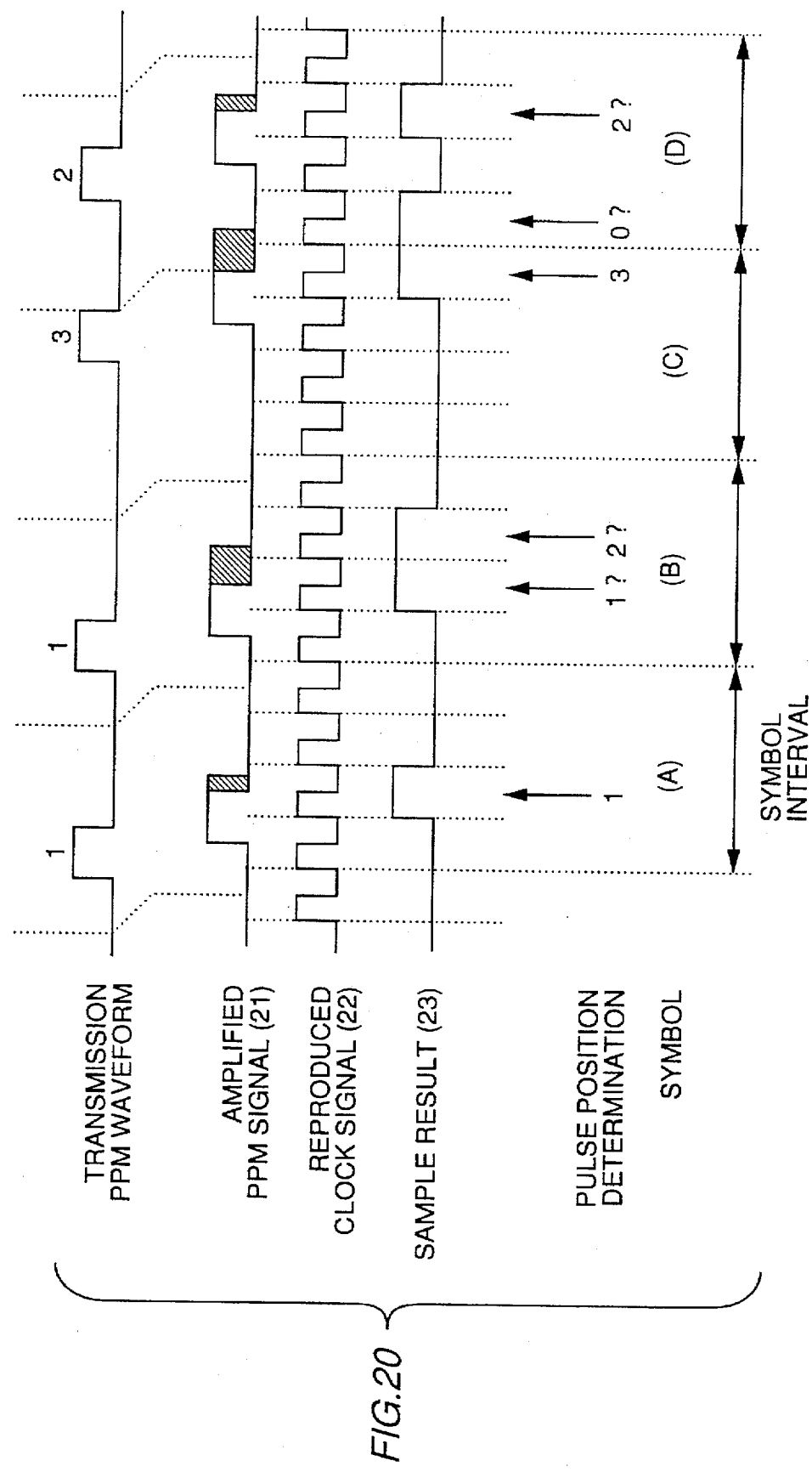
FIGS. 20 and 21 are timing charts of a conventional PPM demodulation device that fails in demodulation.
Figure 21:
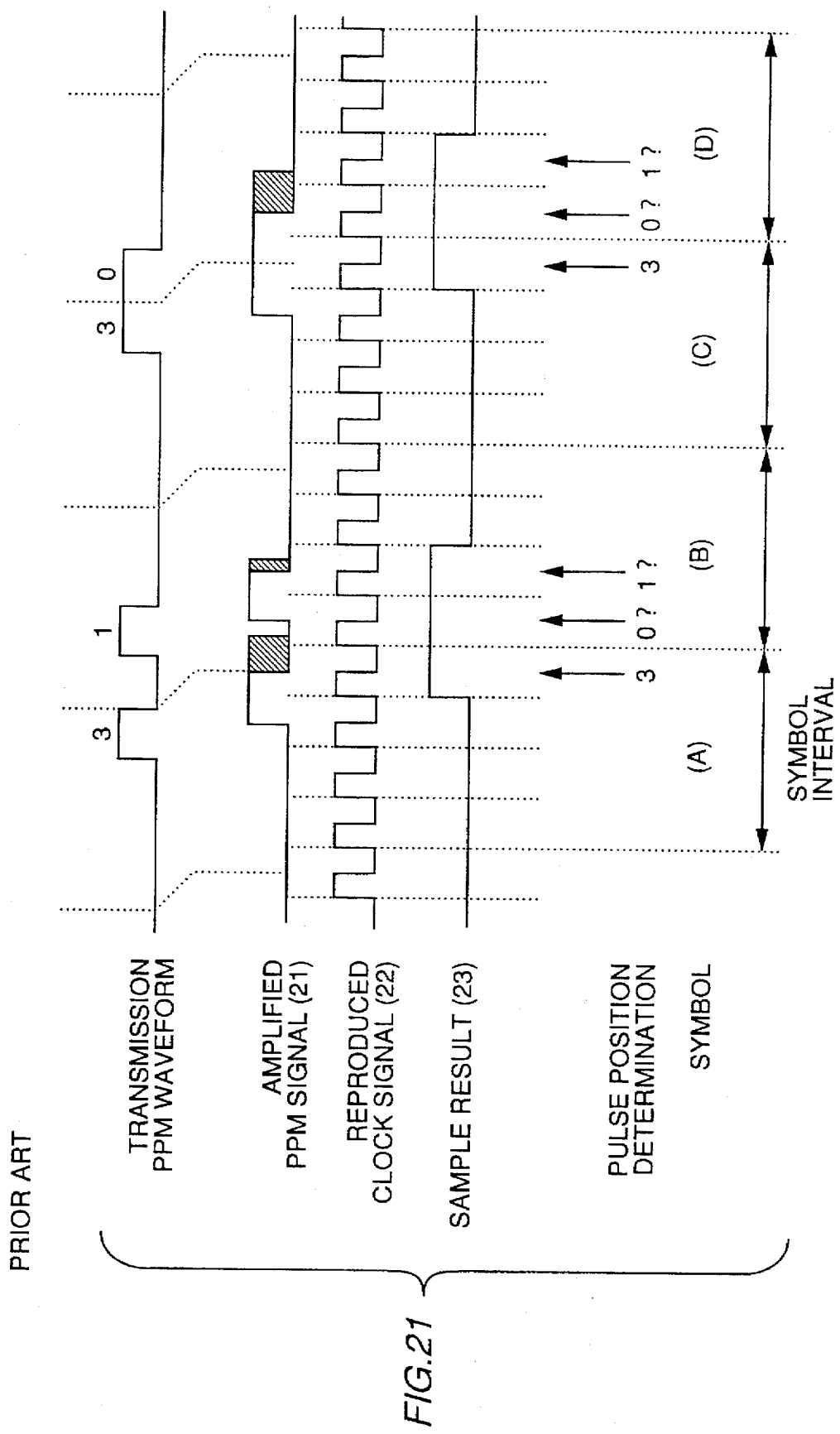

FIG. 3 shows a specific structure of sample result hold unit 12 shown in FIG. 1. Referring to FIG. 3, sample result holding unit 12 is formed of D type flipflops 121, 122, 123, . . . 12n connected in series. PPM signal 21 is applied to the D input of the first D type flipflop 121. Reproduced clock signal 22 is applied to the clock input terminal of each of D type flipflops 121, 122, 123, . . . , 12n. Sample result 23 is provided from each of D type flipflops 121, 122, 123, . . . 12n. This sample result 23 is used for symbol synchronizing signal generation unit 14 of FIG. 1 to recognize a start flag pattern, and for reception data reproduction unit 15 to determine reception data. Symbol synchronizing signal generation unit 14 requires a sample result 23 corresponding to the length of the start flag pattern. For example, when the start flag pattern shown in the timing chart of FIG. 19 (pattern of the shaded portion of transmission PPM waveform) is to be used, the pattern is represented as "1000 0000 1001 1000" in pulse slot unit. Therefore, sixteen sample results 23 must be applied from sample result holding unit 12 to symbol synchronizing signal generation unit 14. Reception data reproduction unit 15 can carry out demodulation referring to sample results SAMPLE[2 . . . 0] of three previous data.

Figure 4:
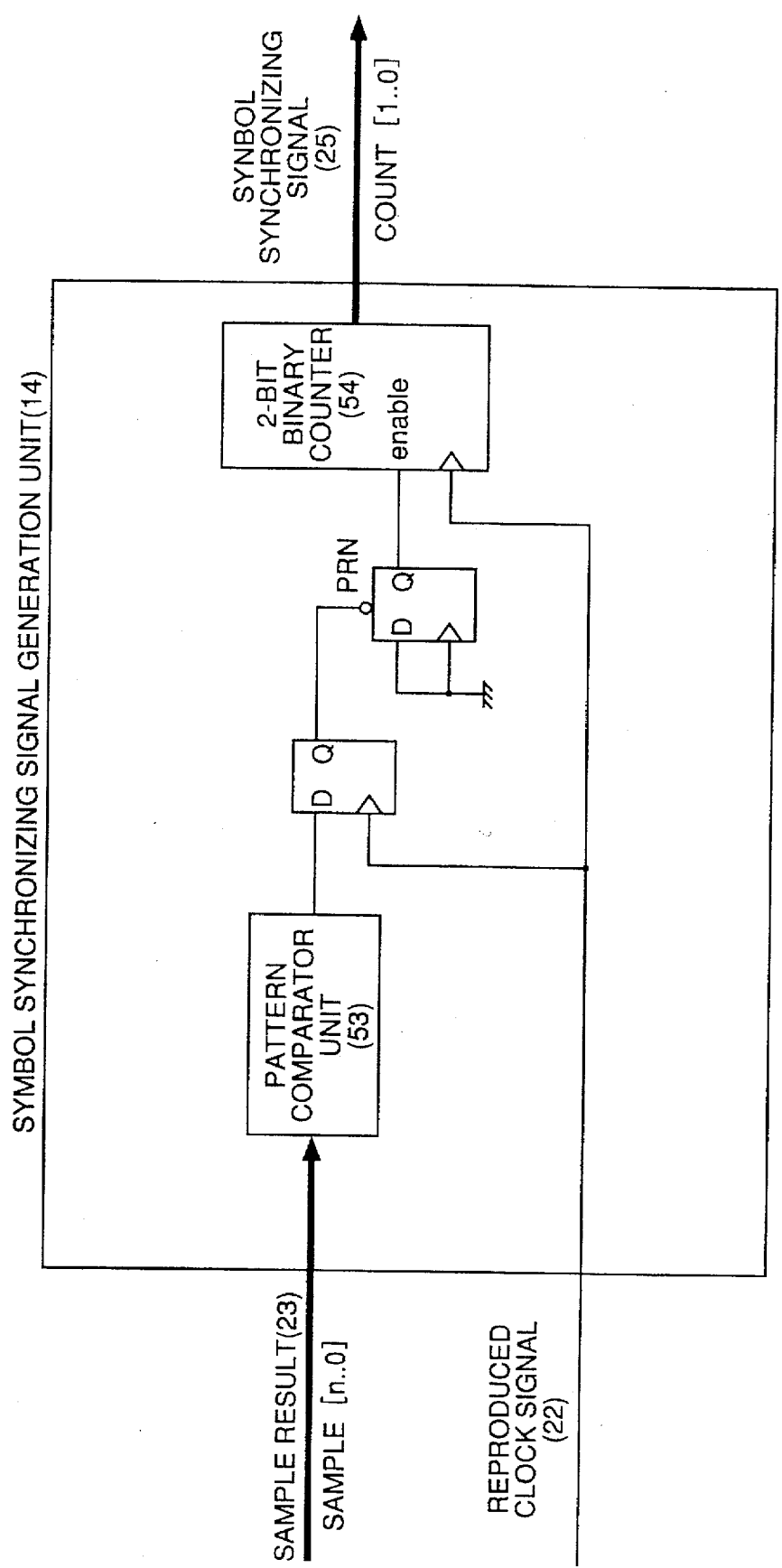
FIG. 4 shows a specific structure of a symbol synchronizing signal generation unit of FIG. 1.

FIG. 4 shows a specific structure of symbol synchronizing signal generation unit 14 shown in FIG. 1. Referring to FIG. 4, symbol synchronizing signal generation unit 14 includes a pattern comparator unit 53, a 2-bit binary counter 54, and D type flipflops 141 and 142. Sample result 23 is applied to pattern comparator unit 53. Pattern comparator unit 53 detects whether the pattern of sample result 23 matches the start flag pattern. Pattern comparator unit 23 can be implemented simply with an AND-OR logic circuit. When the pattern of sample result 23 matches the start flag pattern, a matching signal is applied to the D input of D type flipflop 141. At the rise of the next reproduced clock signal 22, the value of the Q output of D type flipflop 141 attains 1 for only one cycle. The Q output thereof is applied as a preset input of D type flipflop 142. The Q output of D type flipflop 142 is applied to the enable input of 2-bit binary counter 54. When 2-bit binary counter 54 attains an enable state, the value is counted up at every input of reproduced clock signal 22. Output COUNT[1 . . . 0] of 2-bit binary counter 54 becomes symbol synchronizing signal 25.

Figure 5:
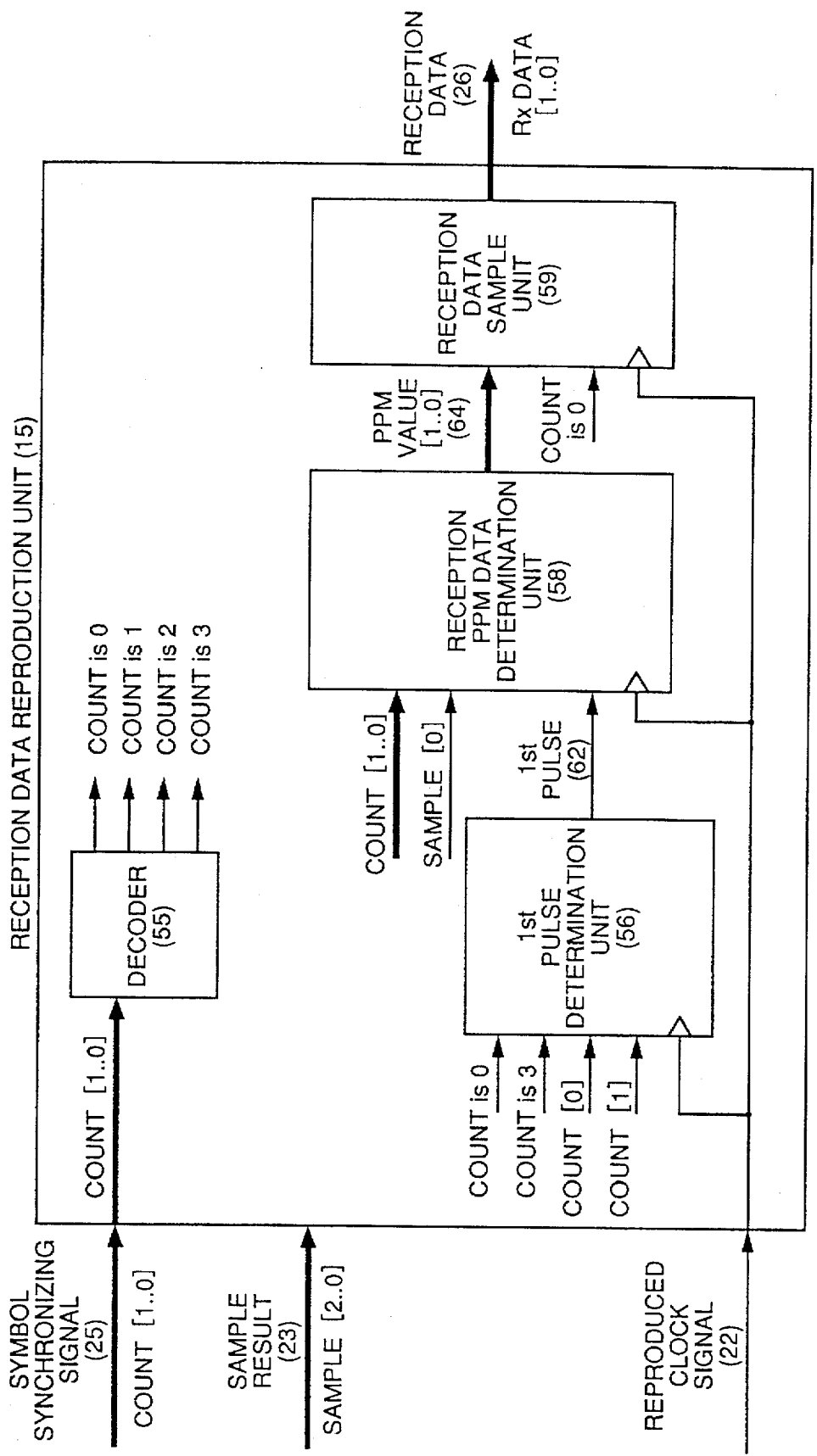
FIG. 5 shows a specific structure of a reception data reproduction unit of FIG. 1.

FIG. 5 shows a specific structure of reception data reproduction unit 15 of FIG. 1. Reception data reproduction unit 15 includes a decoder 55, a first pulse determination unit 56, a reception PPM data determination unit 58, and a reception data sample unit 59. Decoder 55 decodes symbol synchronizing signal 25 to provide signals COUNTis0, COUNTis1, COUNTis2, COUNTis3 that attain an H level when the value of COUNT[1 . . . 0] of symbol synchronizing signal 25 becomes 0, 1, 2, 3, respectively. First pulse determination unit 56 receives COUNTis0 and COUNTis3 from decoder 55, SAMPLE[0], SAMPLE[1] of sample result 23, and reproduced clock signal 22 to determine whether a first valid pulse is detected or not within the symbol according to reproduced clock signal 22. 1stPULSE62 which is the output of first pulse determination unit 56 is applied to reception PPM data determination unit 58. Reception PPM data determination unit 58 actually carries out PPM demodulation while referring to COUNT[1 . . . 0], SAMPLE[0], and the output of the first pulse determination unit 56. Reception data sample unit 59 samples the demodulated result of reception PPM data determination unit 58 at an appropriate timing to provide reception data.

Figure 6:
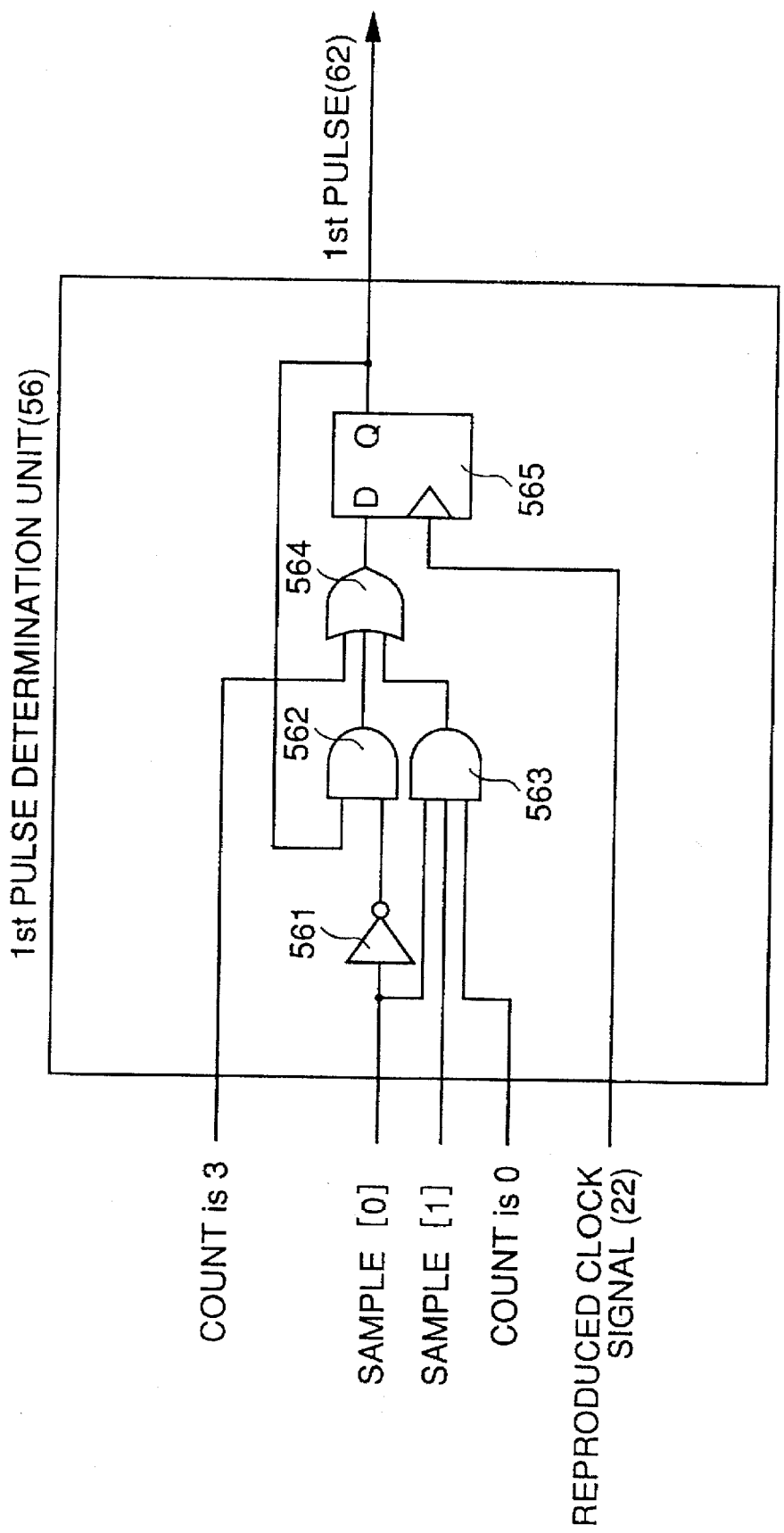
FIG. 6 shows a specific structure of a first pulse determination unit of FIG. 5.

FIG. 6 shows a specific structure of first pulse determination unit 56 of FIG. 5. Referring to FIG. 6, first pulse determination unit 56 includes an inverter 561, AND gates 562 and 563, an OR gate 564, and a D type flipflop 565. First pulse determination unit 56 provides a 1stPULSE62 signal that attains an H level when not one pulse regarded as valid is sampled within the symbol, and that is pulled down to an L level (logical low) when a valid pulse is sampled.

Figure 7:
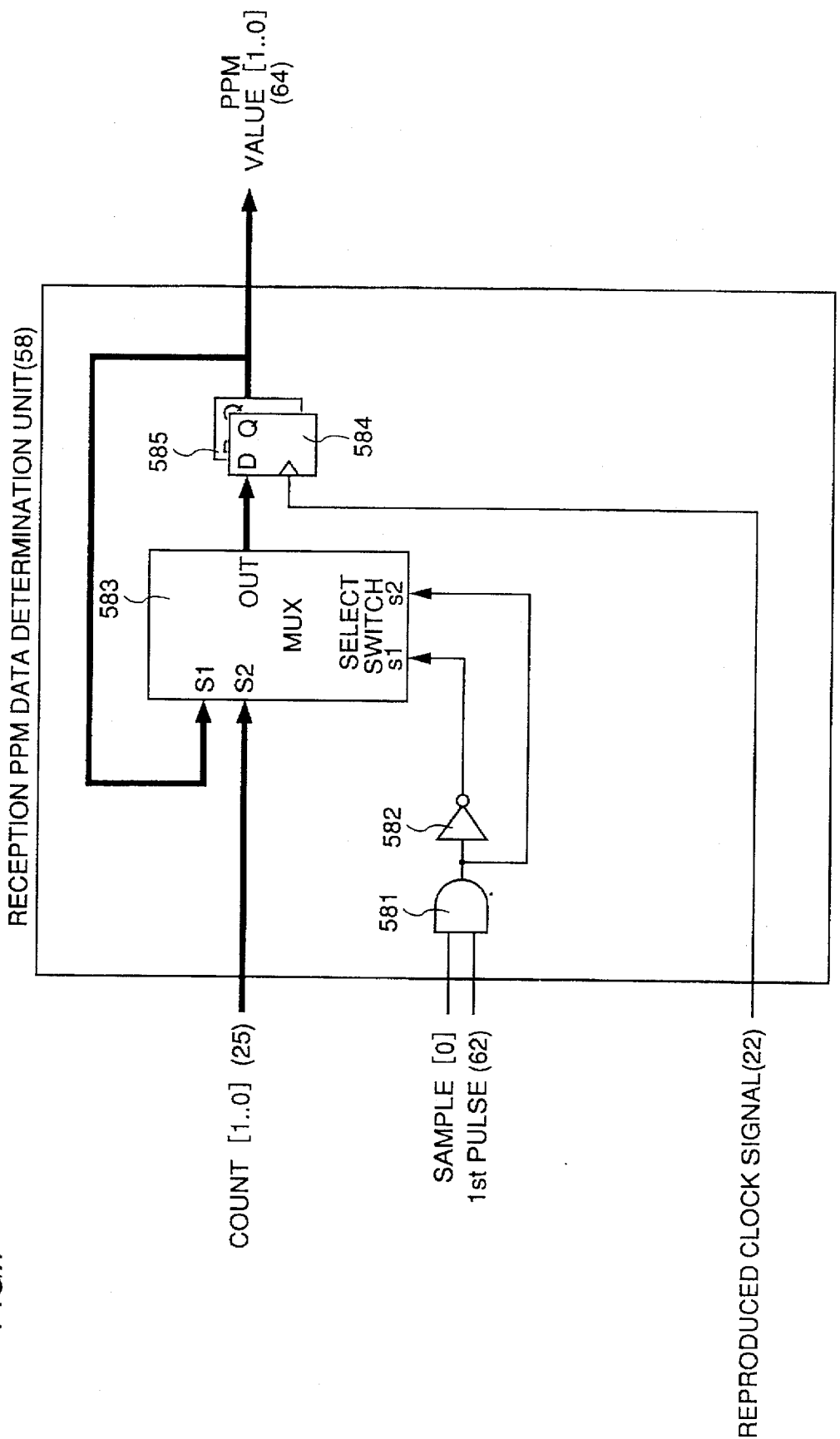
FIG. 7 shows a specific structure of a reception PPM data determination unit of FIG. 5.

FIG. 7 shows a specific structure of reception PPM data determination unit 58. Reception PPM data determination unit 58 includes an AND gate 581, an inverter 582, a MUX 583, and D type flipflops 584 and 585. MUX 583 includes two inputs S1 and S2. PPMVALUECOUNT[1 . . . 0]0 64 which is the output of reception PPM data determination unit 58 is applied to input S1. COUNT[1 . . . 0] 25 is applied to input S2. MUX 583 provides either input S1 or S2 according to the inputs of select switch inputs s1 and s2. The output of AND gate 581 receiving SAMPLE[0] and the input of 1stPULSE62 is inverted by inverter 582 to be applied to input s1. The output of AND gate 581 is applied to switch input s2.

Figure 8:
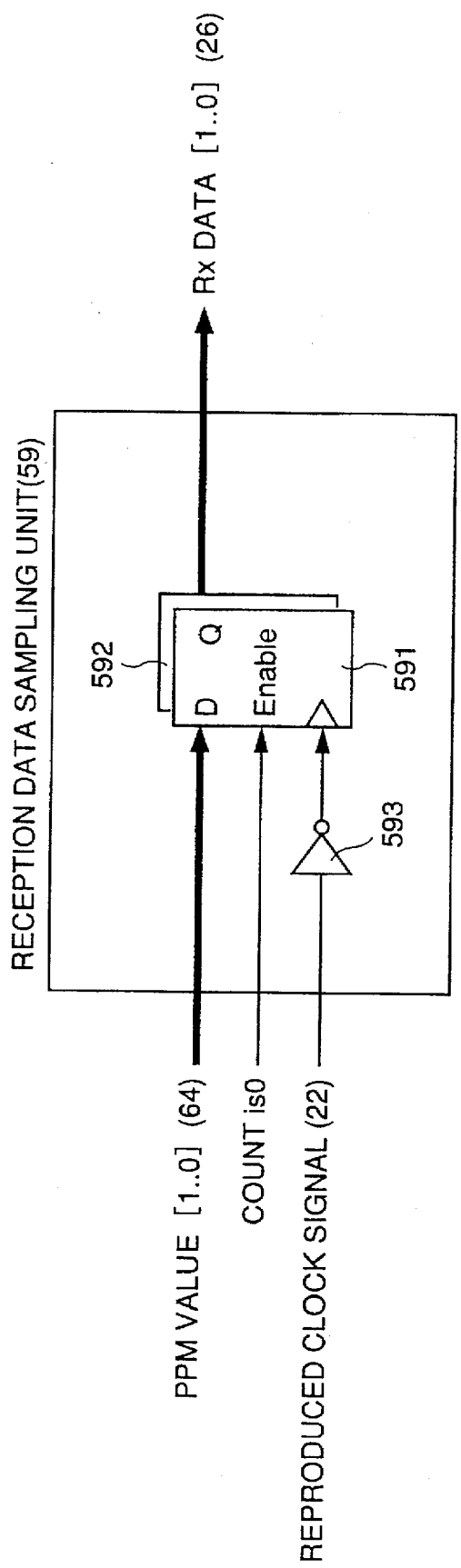
FIG. 8 shows a specific structure of a reception data sampling unit of FIG. 5.

FIG. 8 shows a specific structure of reception data sample units of FIG. 5. Referring to FIG. 8, reception data sampling unit 59 includes two D type flipflops 591 and 592, and an inverter 593. When the count value of symbol synchronizing signal 25 is 0, the value of PPMVALUE COUNT[1 . . . 0] 64 for the previous symbol is already ascertained. Therefore, by latching and sampling the data at the fall of reproduced clock signal 22, D type flipflops 591 and 592 determine reception data RxDATA[1 . . . 0] 26 subjected to demodulation.

Figure 9:
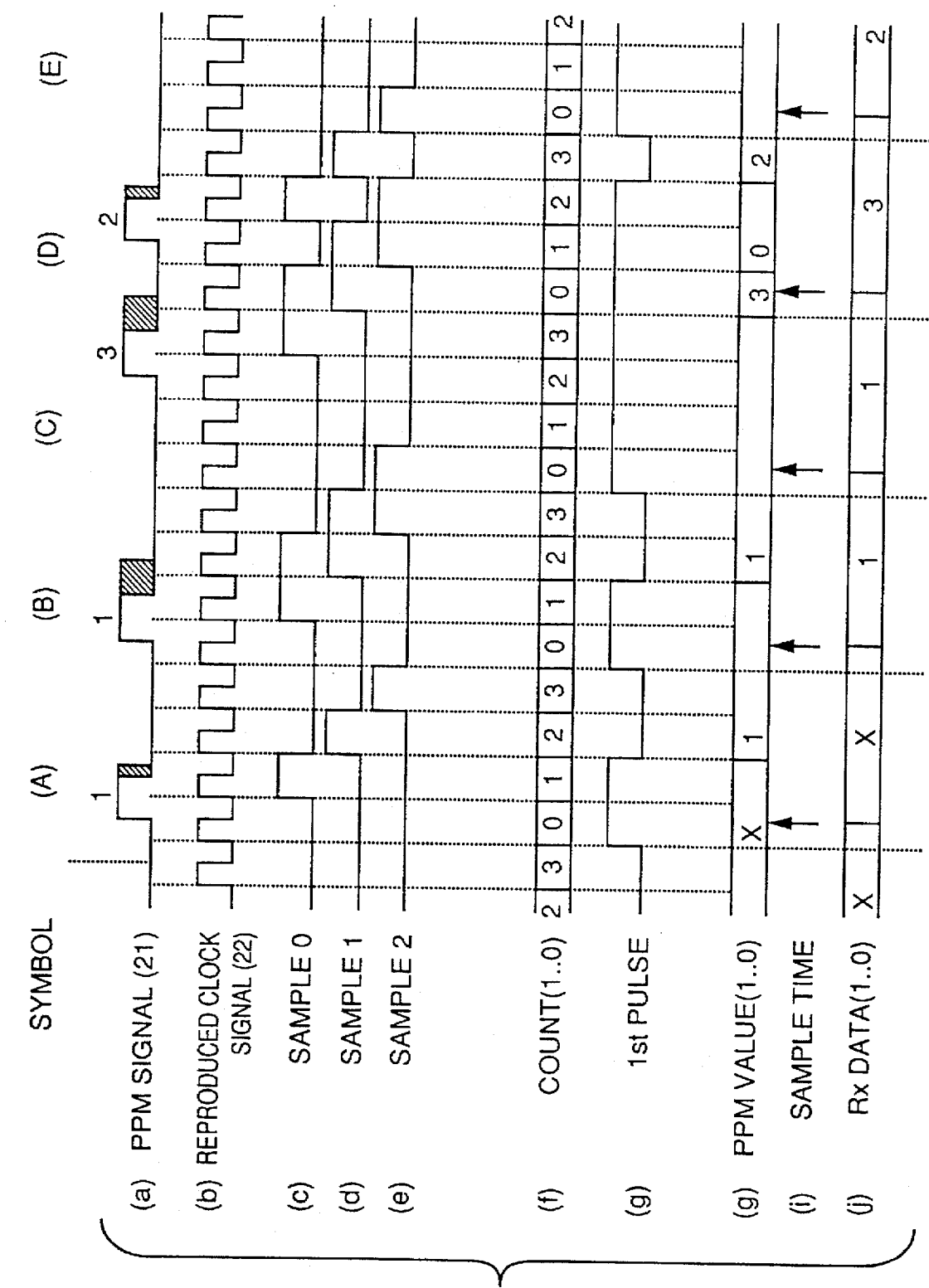
FIGS. 9 and 10 are timing charts for describing specific operations of the first embodiment.
Figure 10:
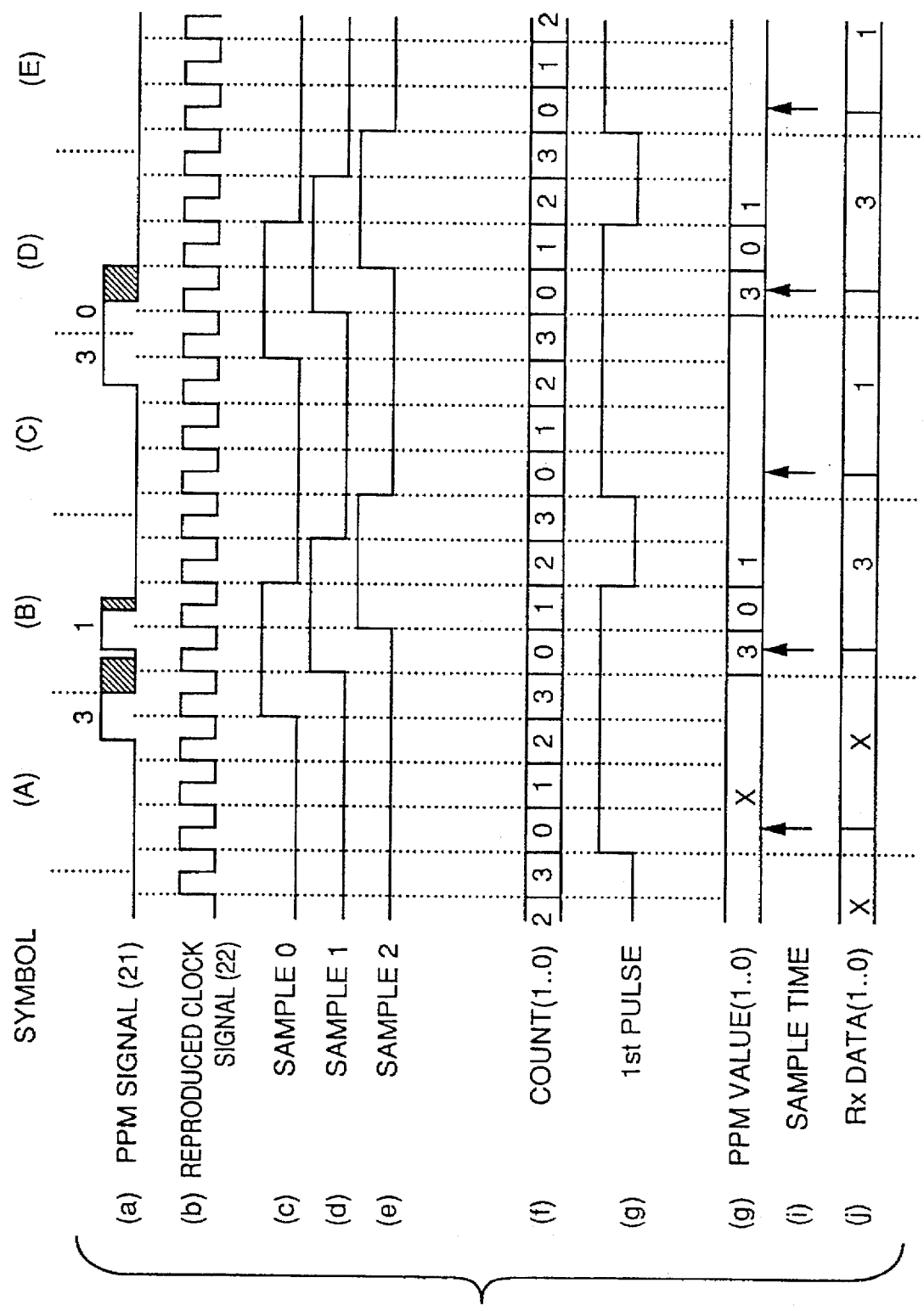

FIGS. 9 and 10 are timing charts for describing the operation of the first embodiment of FIG. 10. The operation of the first embodiment will be described in detail hereinafter with reference to FIGS. 1–10. As shown in FIG. 1, infrared signal 41 is received at Pin-PD31 and amplified by amplifier 32 to result in PPM signal 21 as shown in FIG. 9(a). Clock reproduction unit 11 generates reproduced clock signal 22 shown in FIG. 9(b) in synchronization with PPM signal 21 according to master clock signal 42 from crystal oscillator 33.

As described with reference to FIG. 3, sample result holding unit 12 has D type flipflops 121, 122, 123, . . . 12n sample PPM signal 21 according to reproduced clock signal 22 to provide SAMPLE 0, SAMPLE 1, SAMPLE 2, . . . shown in (c)–(e) of FIG. 9 as sample result 23 to symbol synchronizing signal generation unit 14 and reception data reproduction unit 15.

As described with reference to FIG. 4, symbol synchronizing signal generation unit 14 has pattern comparator unit 53 compare the pattern of sample result 23 with the start flag pattern. When the compared pattern match, 2-bit binary counter 54 initiates counting of reproduced clock signal 22. The count value of 2-bit binary counter 54 is as shown in FIG. 9(f). By setting the initial value of 2-bit binary counter 54 to 0, the value of COUNT[1 . . . 0] can be made to match the pulse position represented by SAMPLE[0]. More specifically, referring to FIG. 9, the first pulse position of PPM signal 21 is 1. The value of COUNT[1 . . . 0] at the time point where SAMPLE[0] attains an H level corresponding to that pulse also becomes 1. The last pulse position is 2. The value of COUNT[1 . . . 0] at the time point where SAMPLE [0] attains an H level corresponding to that pulse is 2.

Next, reception data reproduction unit 15 carries out demodulation according to sample result 23 and the information of symbol synchronization signal 25. It is appreciated from the demodulation operation at symbols (A), (B), and (C) of FIG. 9 that determination is made of transmission of a pulse having the value of COUNT[1 . . . 0] shown in FIG. 9(f) at the time point when SAMPLE[0] first attains an H level in the symbol.

However, as in the demodulation operation for symbol (D) in FIG. 9, the rise of SAMPLE[0] to an H level at the pulse position of 0 during that symbol will not provide the instant determination that the pulse position is 0. Determination is deferred. This is because there is a possibility that the pulse is extended to the pulse position of 0 of the current symbol such as in the case where SAMPLE[0] attains an H level also at the pulse position of 3 of the immediate preceding symbol. When there is SAMPLE[0] attaining an H level also at another position in that symbol, determination is made that the latter pulse is transmitted. When there is no SAMPLE[0] attaining an H level during that symbol, determination is made that the transmitted pulse position is 0. This determination is carried out by reception data reproduction unit 15. Details will be described hereinafter.

In reception data reproduction unit 15, decoder 55 decodes COUNT[1 . . . 0] to generate COUNTis0, COUNTis1, COUNTis2, and COUNTis3 indicating that the COUNT value is 0, 1, 2, 3, respectively. First pulse determination unit 56 generates 1stPULSE62 indicating whether a first pulse regarded as valid in the symbol is detected or not as shown in FIG. 9(g). The generated 1stPULSE62 is applied to reception PPM data determination unit 58.

The operation of first pulse determination unit 56 of FIG. 6 will be described in detail hereinafter. Since a new symbol will next start when the count value of symbol synchronizing signal 25 is 3, COUNTis3 is applied to the D input of D type flipflop 565 via OR gate 564. The output of D type flipflop 565 is set to 1 simultaneous to the rise of reproduced clock signal 22. When 1stPULSE=1 and SAMPLE[0]=0, i.e., when a pulse is not yet detected, the output of inverter 561 attains an H level, whereby AND gate 562 is opened. A signal of an H level is applied to the D input of D type flipflop 565. Therefore, 1stPULSE remains 1. When a pulse is detected at 1stPULSE=1 and SAMPLE[0]=1, AND gate 562 is closed, and the D input of D type flipflop 565 attains an L level. Therefore, the 1stPULSE is 0.

However, when the count value of symbol synchronizing signal 25 is 0, i.e., COUNTis0=1 in detecting a pulse, or when SAMPLE[0] and SAMPLE[1] of the last two sample results 23 both attain an H level, there is a possibility that the currently detected pulse is a sample of that extended from the pulse position of 3 of the preceding symbol. Therefore, AND gate 563 is opened, and 1stPULSE remains at 1. This corresponds to symbol (D) in FIG. 9. Since the count value of PPMVALUE[1 . . . 0] is updated to 0 as shown in FIG. 9(h), determination is made that the proper pulse exists at the position of count value "0" by reception PPM data determination unit 58 if a new pulse is not detected in the same symbol. However, since the 1stPULSE remains at the H level, the count value in reception PPM data determination unit 58 is further updated when a new pulse is detected at a latter portion of the same symbol.

Next, when the sample result is 1 (SAMPLE[0]=1) and determination is made that it is the first pulse in the symbol (1stPULSE=1) as shown in FIG. 7, the output of AND gate 581 attains an H level, and MUX 583 selects input S2 in reception in PPM data determination unit 58. Flipflops 584 and 585 are updated from the value of PPMVALUE[1 . . . 0] to the count value of the symbol synchronizing signal 25 COUNT[1 . . . 0]) simultaneous to the rise of reproduced clock signal 22. Otherwise, input S1 is selected, and the value of PPMVALUE[1 . . . 0] is maintained at the previous value.

When COUNTis0 attains an H level, the value of PPMVALUE[1 . . . 0] 64 with respect to the previous symbol is already ascertained, as shown in FIG. 8. Therefore, reception data sampling unit 59 samples data at the fall of reproduced clock signal 22 to reproduce reception data RxDATA[1 . . . 0] as shown in FIG. 9(j). It is appreciated from the result of FIG. 9(j) that data is properly demodulated in all cases. More specifically, RxDATA [1 . . . 0] indicated in FIG. 9(j) has a value identical to the pulse value of PPM signal 21 shown in FIG. 9(a).

In the above-described first embodiment of FIGS. 1–8, there is a case where a subsequent symbol is not demodulated properly when the sample result of three pulse positions, i.e., pulse positions 0 and 1 and the pulse position of an immediate preceding pulse position, attain an H level as in the cases of symbols (A) and (B) or symbols (C) and (D) of PPM signal 21 shown in FIG. 10(a). In other words, proper demodulation is carried at symbols (A) and (B), and not at symbols (C) and (D). Therefore, the values of data RxDATA[1 . . . 0] are 3, 1, 3, 1 although the positions of the transmitted pulse are 3, 1, 3, 0. Demodulation in the first embodiment fails only when a waveform such as in symbols (C) and (D) is input. This waveform input is referred to as "multiplepulse expand waveform" hereinafter. A second embodiment solving this disadvantage will be described hereinafter.

Figure 11:
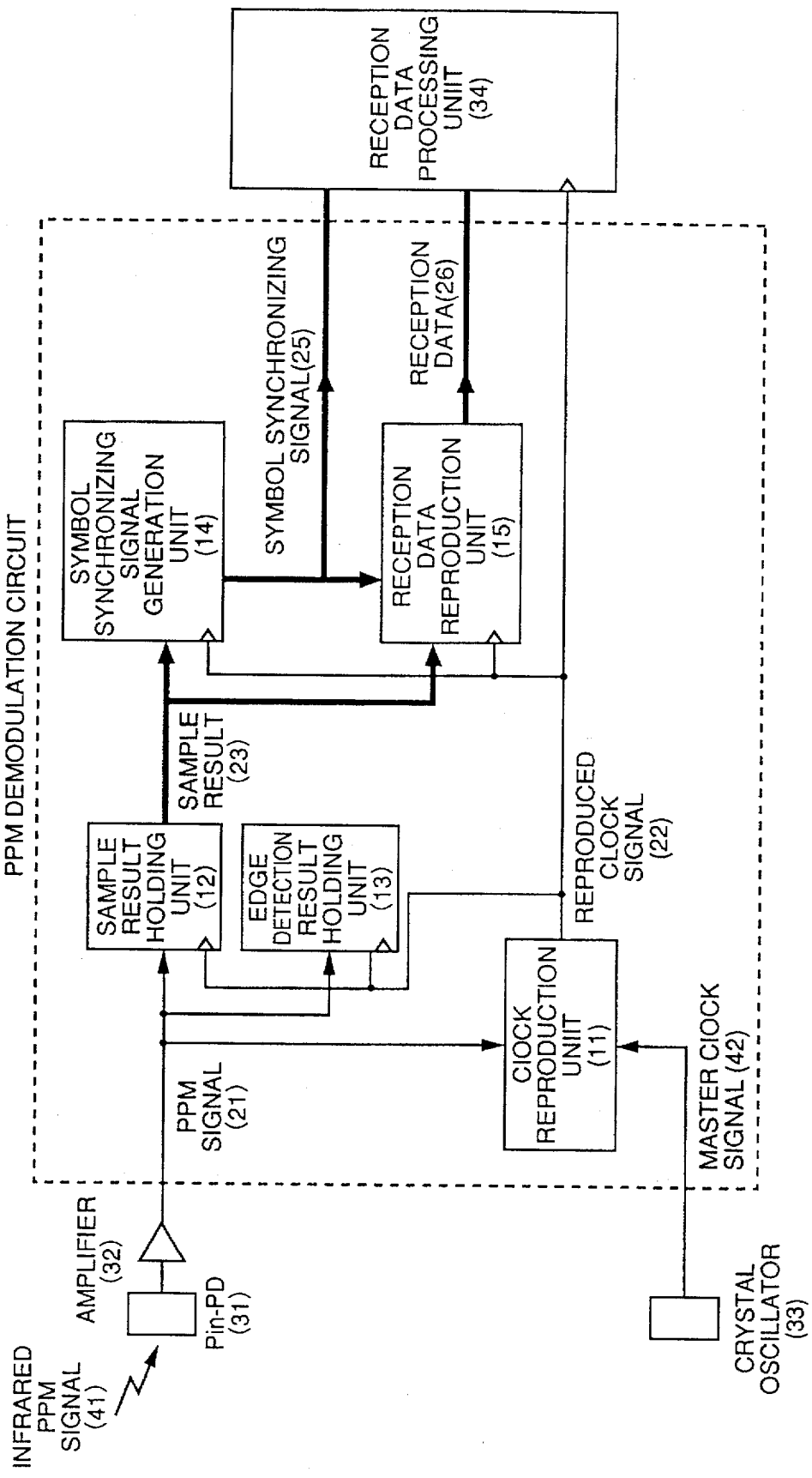
FIG. 11 is a block diagram showing an entire structure of a second embodiment of the present invention.

FIG. 11 is a block diagram showing an entire structure of a second embodiment of the present invention. The structure shown in FIG. 11 is similar to the structure of FIG. 1 provided that an edge detection result holding unit 13 is newly provided in the PPM demodulation device of FIG. 1 and that reception data reproduction unit 15 is improved.

Edge detection result holding unit 13 is provided to solve the disadvantage described with reference to FIG. 10. More specifically, when distortion of the waveform is great, the value of demodulated data RxDATA[1 . . . 0] becomes the same in the case where PPM signal 21 of 3, 1 is transmitted and in the case where PPM signal 21 of 3, 0 is transmitted as shown in the left side and right side, respectively, in FIG. 10(a). In order to always provide a proper determination even when the waveform is greatly distorted, the information of edge detection result 24 must be used. Application of just sample result 23 to reception data reproduction unit 15 is not sufficient.

Figure 12:
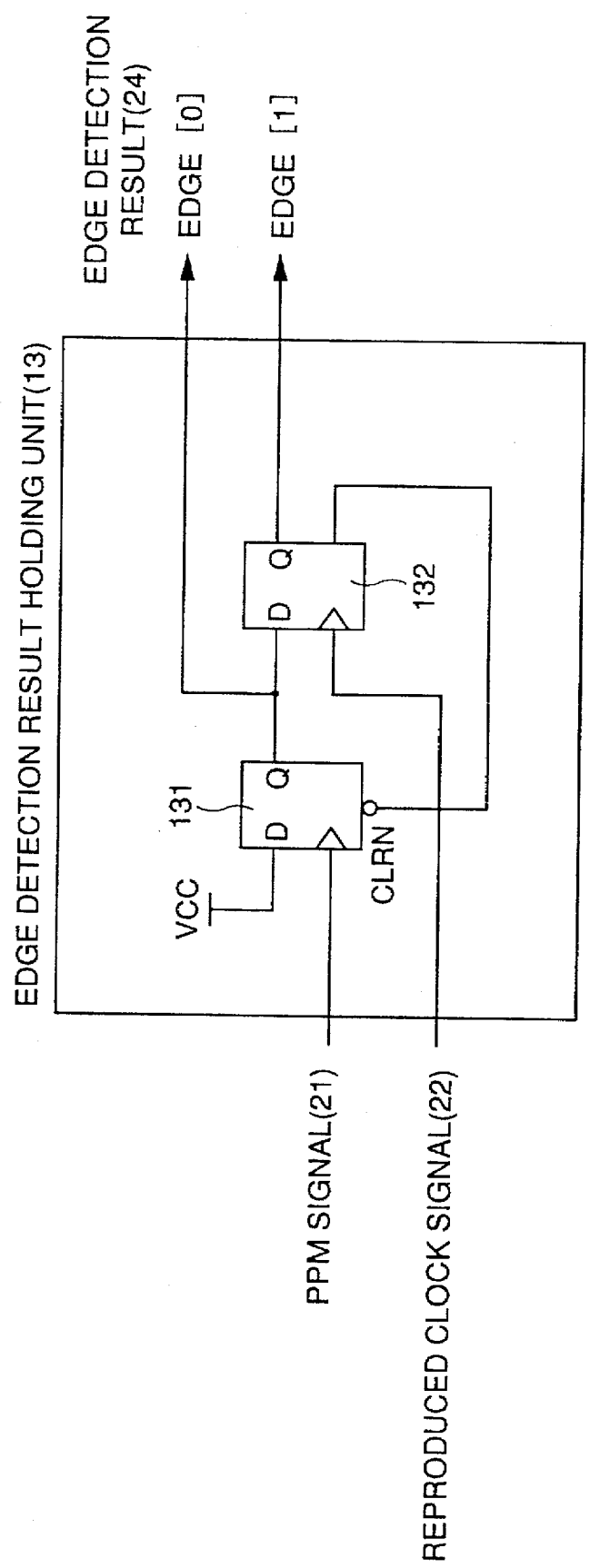
FIG. 12 shows a specific structure of an edge detection result holding unit of FIG. 11.

FIG. 12 is a specific example of edge detection result holding unit 13 of FIG. 11. Referring to FIG. 12, edge detection result holding unit 13 includes D type flipflops 131 and 132. D type flipflop 131 receives a power supply voltage Vcc at its D input and PPM signal 21 at its clock input terminal. EDGE[0] signal is provided from the Q output to be applied to the D input of D type flipflop 32. Reproduced clock signal 22 is applied to the clock input terminal of D type flipflop 132. Signal EDGE[1] signal is provided from the Q output of D type flipflop 132. An inverted version of signal EDGE[1] is applied to D type flipflop 131 as a clear signal. Therefore, the Q output of D type flipflop 131 attains an H level at a rise of PPM signal 21. The Q output of D type flipflop 132 attains an H level at a rise of the next reproduced clock signal 22.

Figure 13:
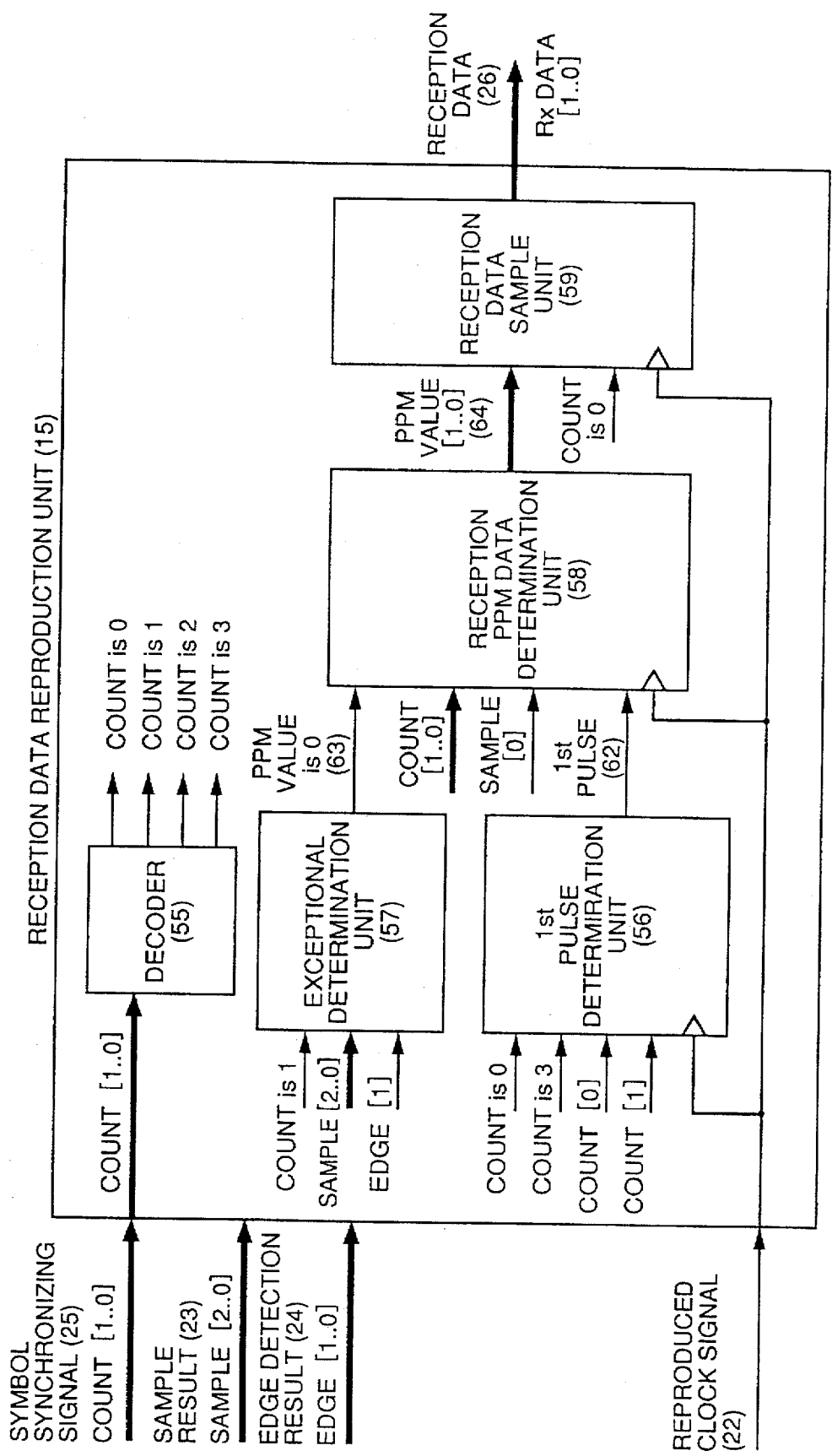
FIG. 13 shows a specific structure of a reception data reproduction unit of FIG. 11.

FIG. 13 shows a structure of reception data reproduction unit 15 of FIG. 11. An exceptional determination unit 57 is newly provided in reception data reproduction unit 15. This reception data reproduction unit 15 of FIG. 13 differs from reception data reproduction unit 15 shown in FIG. 5 in that PPMVALUEis0 signal 63 which is the output of exceptional determination unit 57 is applied to reception PPM data determination unit 58.

Figure 14:
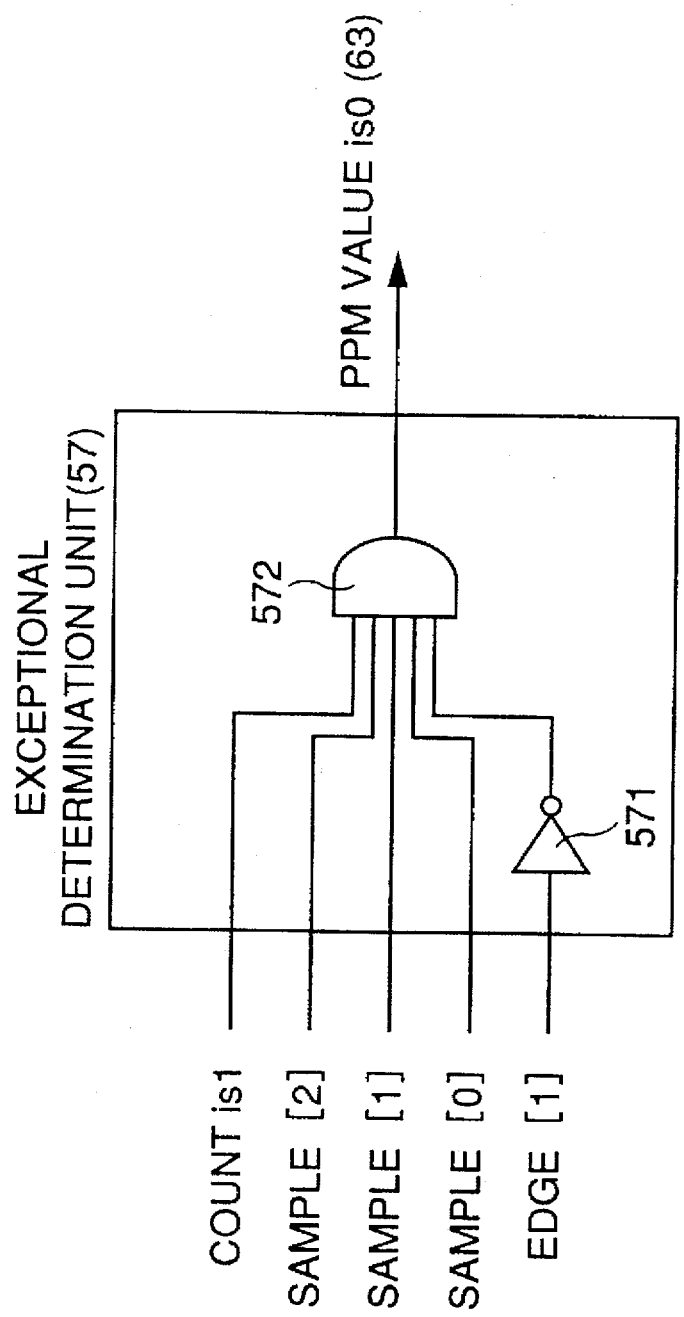
FIG. 14 shows a specific structure of an exceptional determination unit of FIG. 13.

FIG. 14 shows a structure of exceptional determination unit 57 of FIG. 13. Referring to FIG. 14, exceptional determination unit 57 includes an inverter 571 and an AND gate 572. Inverter 571 provides an inverted version of signal EDGE[1] to one input terminal of AND gate 572. COUNTis1 and SAMPLE[2], SAMPLE[1], and SAMPLE[0] are applied to the other input terminal of AND gate 572. PPMVALUEis0 signal 63 is provided from AND gate 572. This signal attains an H level only when the count value of symbol synchronizing signal 25 is 1 (COUNTis1), when all the three previous sample results 23 attain an H level, and when there is no rising edge of a PPM signal between the latest sampling time and the previous sampling time.

Figure 15:
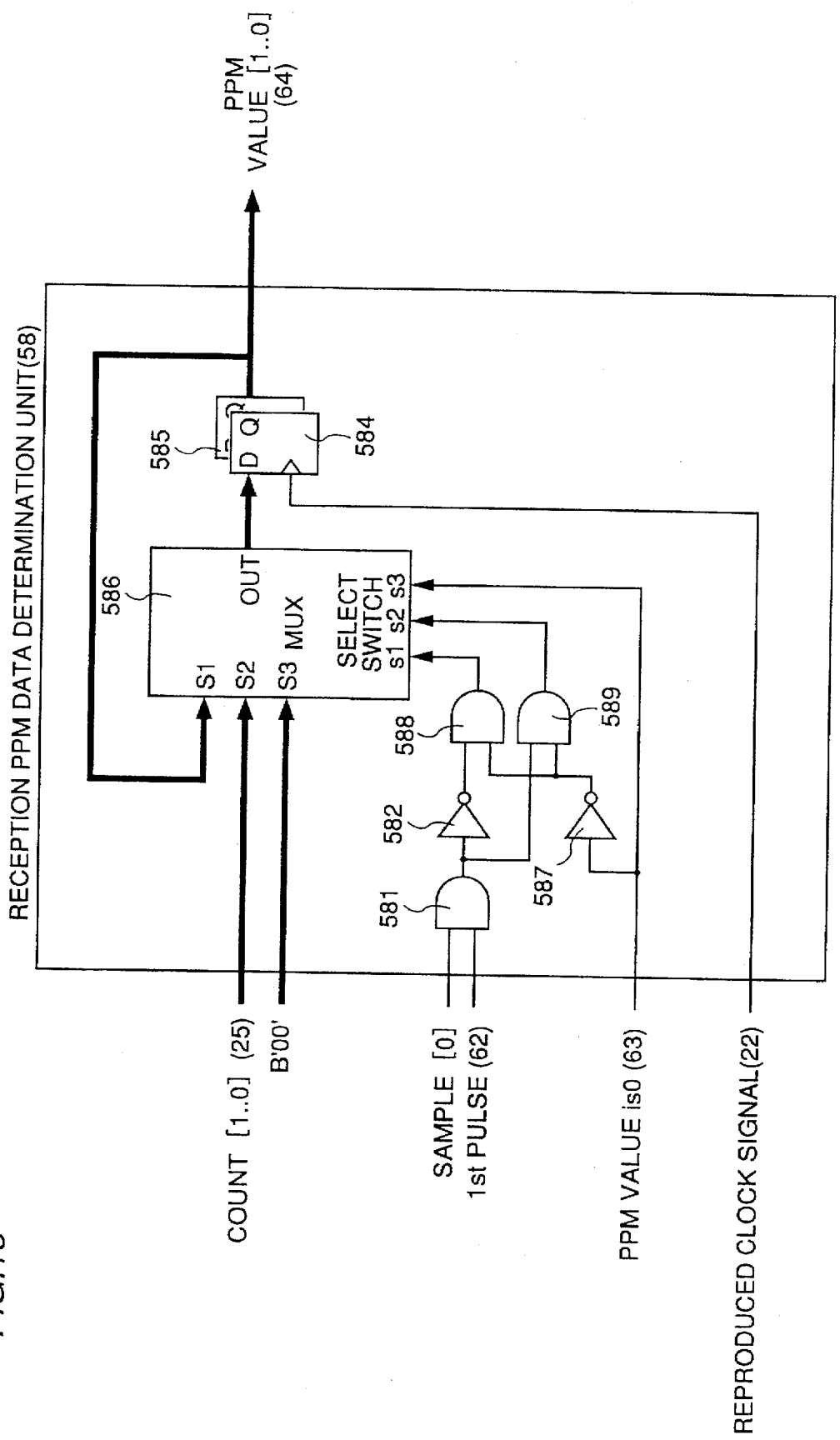
FIG. 15 shows a specific structure of a reception PPM data determination unit of FIG. 13.

FIG. 15 shows a structure of reception PPM data determination unit 58 shown in FIG. 13. Reception PPM data determination unit 58 of FIG. 15 differs from that shown in FIG. 7 in that MUX 586 includes an input S3 and a select switch s3, and that an inverter 587 and AND gates 588 and 589 are provided. PPMVALUEis0 signal 63 from exceptional determination unit 57 is inverted at inverter 587 and applied to respective one input terminals of AND gates 588 and 589, and also to select switch input s3. The output of inverter 582 is applied to the other input terminal of AND gate 588. The output of AND gate 581 is applied to the other input terminal of AND gate 589.

Figure 16:
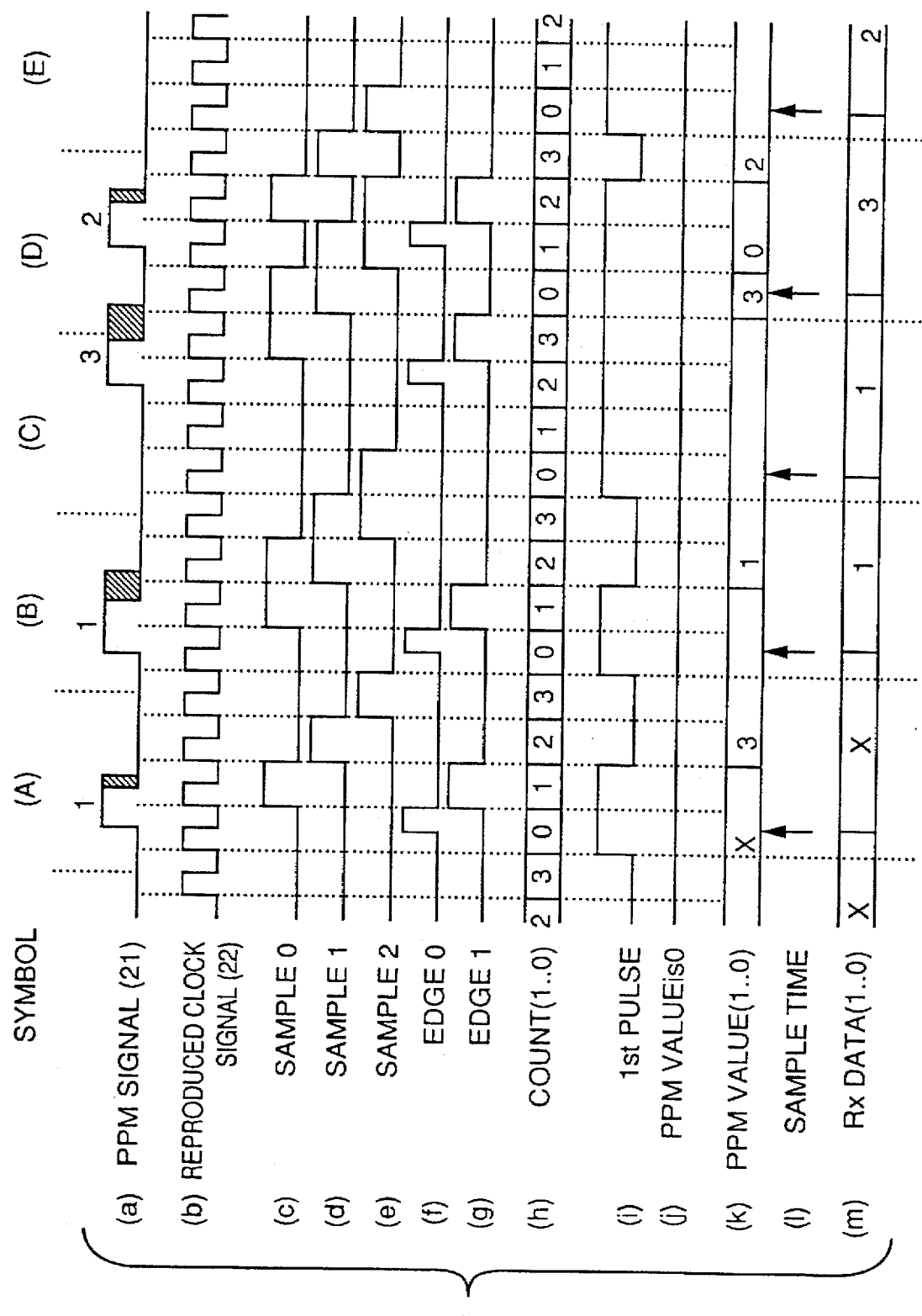
FIGS. 16 and 17 are timing charts for describing specific operations of the second embodiment.
Figure 17:
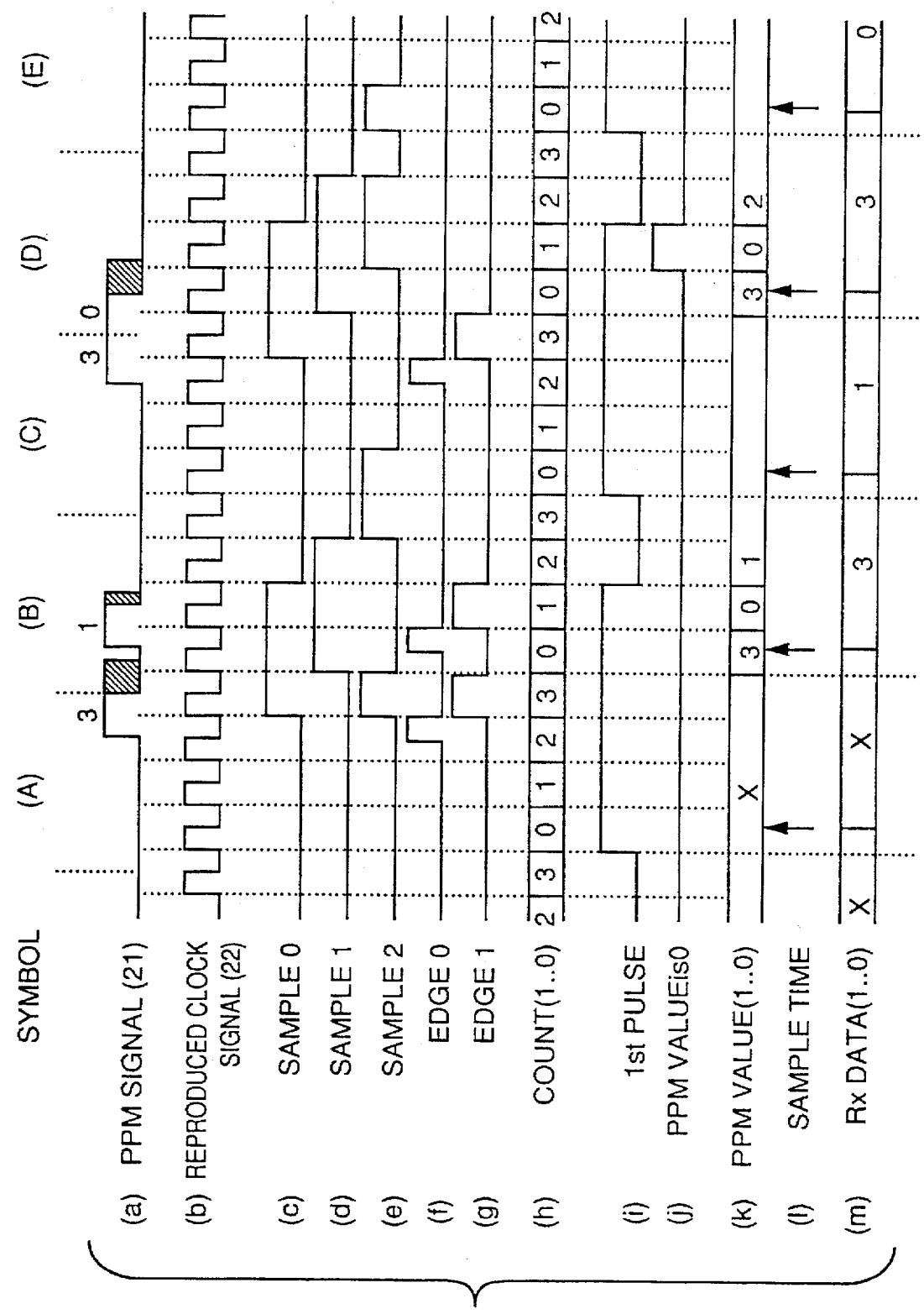
Figure 18:
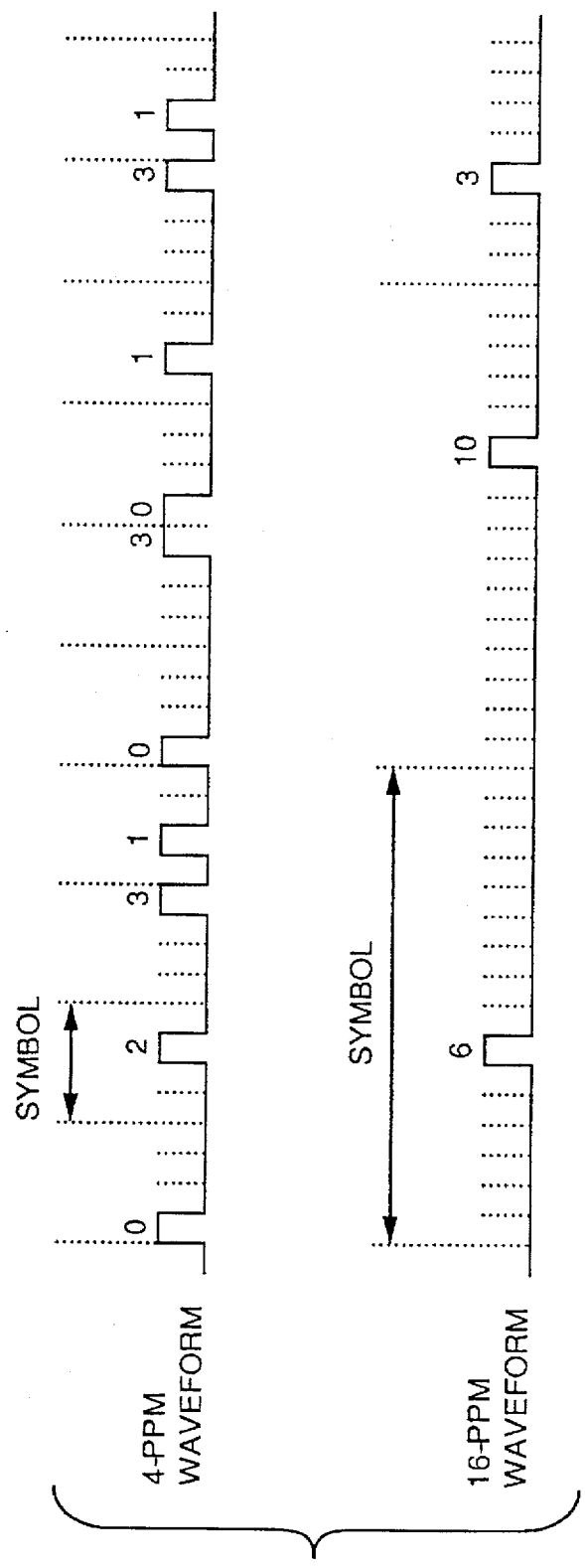
FIG. 18 is a waveform diagram of a modulation system of PPM.

FIGS. 16 and 17 are timing charts for describing specific operations of the second embodiment.

The operation of the second embodiment will be described hereinafter with reference to FIGS. 11–17. The operation of clock reproduction unit 11, sample result holding unit 12, and symbol synchronizing signal generation unit 14 of FIG. 11 are identical to those of the first embodiment. Therefore, their description will not be repeated. The operation of edge detection result holding unit 13 which is the feature of the second embodiment will be described.

When PPM signal 21 shown in FIG. 16(a) attains an H level, D type flipflop 131 in edge detection result holding unit 13 is set at the rising edge of PPM signal 21. As shown in FIG. 16(f), EDGE0 which is the Q output rises to an H level. When reproduced clock signal 22 shown in FIG. 16(b) rises, D type flipflop 132 is set. As shown in FIG. 16(g), EDGE1 which is the Q output rises to an H level. Since D type flipflop 131 is cleared when the Q output of D type flipflop 132 is driven to an H level, no new rise can be detected during that time. However, this is not a problem since two continue rise operations will not occur taking account of the waveform of PPM signal 21.

Reception data reproduction unit 15 of FIG. 13 carries out demodulation referring to the information of the edge detection result EDGE[1 . . . 0]. First, exceptional determination unit 57 determines whether a multiple pulse expand waveform is generated or not according to the information of COUNTis1, SAMPLE[0], SAMPLE[1], SAMPLE[2] and EDGE[1]. More specifically, when there are inputs as in symbols (C) and (D) of FIG. 17, the three previous sample results 23 of (c), (d), and (e) of FIG. 17 all attain an H level when the count value of symbol synchronizing signal 25 shown in FIG. 17(h) is 1. Also, there is no rise of PPM signal 21 between the latest sample time and the immediate preceding sample time, and EDGE[1] shown in FIG. 17(g) attains an L level. When all these conditions are met, exceptional determination unit 57 provides a PPMVALUEis0 signal 63 of an H level as shown in FIG. 17(j).

When PPMVALUEis0 signal 63 attains an H level, the output of inverter 587 of reception PPM data determination unit 58 shown in FIG. 15 attains an L level, whereby AND gates 588 and 589 are closed. MUX 586 selects input S3 according to PPMVALUEis0 signal 63 of an H level. B'00' where two bits are 0 is set in input S3. MUX 586 sets the 0 of two bits to D type flipflops 584 and 585. As a result, PPMVALUE[1 . . . 0] is set to 0 as shown in FIG. 17(k). Therefore, in contrast to the erroneous demodulation of PPMVALUE[1 . . . 0]=1 for symbol (D) in the first embodiment, proper demodulation of PPMVALUE[1 . . . 0]=0 is obtained as an exceptional process in the second embodiment.

When a multiple pulse expand waveform is not generated (when PPMVALUEis0=0), and the sample result is 1 (SAMPLE[0]=1), and when it is the first pulse in the symbol (first PULSE=1) in reception PPM data determination unit 58, input S2 is selected, and the value of PPMVALUE[1 . . . 0] is updated to the count value of the symbol synchronizing signal (COUNT[1 . . . 0]) simultaneous to the rise of reproduced clock signal 22. Otherwise, reception PPM data determination unit 58 selects input S1, whereby the value of PPMVALUE[1 . . . 0] is maintained at the previous value.

In contrast to the case of a conventional PPM demodulation device where there is a great possibility of error generation or transmission failure when a PPM signal is input having a pulse width that is extended greater than approximately 1.5 times the original pulse width, the PPM demodulation device of the present invention allows demodulation to be carried out properly even when a PPM signal of a pulse width that is extended up to approximately two times the original pulse width is applied. Also, an amplifier or the like connected to the PPM demodulation device of the present invention has the restriction of an output pulse width in amplifying a pulse relaxed. Therefore, circuitry can be implemented without any complex structure of an AGC.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A PPM demodulation device for demodulating reception data that is pulse position modulated with a pulse that alters between a first level and a second level inserted into a predetermined symbol position, said PPM demodulation device comprising:

clock reproduction means for providing a reproduced clock signal from said pulse position modulated reception data, sample result holding means for sampling said pulse position modulated reception signal by said clock reproduction means for holding a result thereof, symbol synchronizing signal generation means for generation a symbol synchronizing signal to achieve synchronization of said symbol position according to said reception data, and demodulation means for, when there is reception data of said second level at a plurality of pulse slot positions within the same symbol indicated by said symbol synchronizing signal out of sampling data held by said sample result holding means, rendering valid a pulse of a pulse slot position first detected of the second level within said symbol.

2. The PPM demodulation device according to claim 1, wherein said demodulation means renders valid a pulse of a pulse slot position first detected of the second level within said symbol when there is said reception data of the second level at continuous pulse slot positions within said same symbol.

3. The PPM demodulation device according to claim 1, wherein said demodulation means determines, when a pulse of the second level is detected at a plurality of pulse slot positions within the same symbol, pulse positions excluding the first pulse position in said symbol only when one of pulse slot positions of the pulse is the first pulse slot position, and a pulse of the second level is also detected at an immediate preceding pulse position.

4. The PPM demodulation device according to claim 1, further comprising edge detection means for detecting a leading edge of said reception data between said reproduced clock signals, wherein said demodulation means determines, when a pulse of the second level is detected at a plurality of pulse slot positions within the same symbol, that there is a pulse at the first pulse slot within said symbol in the case where two of the plurality of pulse slot positions is the first and second pulse slot positions, and a pulse of the second level is detected also at the last pulse position of an immediate preceding symbol, and a leading edge is not detected by said edge detection means during the time when said first and second pulse slots are sampled.

5. The PPM demodulation device according to claim 1, wherein said clock reproduction means includes clock generation means for generating a master clock signal, oscillation means for self-oscillating to generate a reproduced clock signal, and phase comparator means for comparing a phase of said reception data and a phase of a reproduced clock signal from said oscillation means according to a master clock signal from said clock generation means to control the phase of a reproduced clock signal generated from said oscillation means according to a comparison output thereof.

6. The PPM demodulation device according to claim 1, wherein said sample result holding means includes shift means for shifting said reception data while holding the same according to reproduced clock signal output from said clock reproduction means.

7. The PPM demodulation device according to claim 1, wherein said symbol synchronizing signal generation means includes comparator means for determining a match of a sample of reception data held in said sample result holding means and a predetermined pattern, and counter means responsive to determination of a match of said sample of reception data and said predetermined pattern by said comparator means for counting said reproduced clock signal to output said symbol synchronizing signal.

* * * * *

UNITED STATES PATENT AND TRADEMARK OFFICE
CERTIFICATE OF CORRECTION

PATENT NO. : 5,691,665
DATED : Nov. 25, 1997
INVENTOR(S) : Yoshihiro Ohtani

It is certified that error appears in the above-indentified patent and that said Letters Patent is hereby corrected as shown below:

On the title page, item [30],

Foreign Application Priority Date for JP 7-253061 should be --September 29, 1995-- not June.

Signed and Sealed this

Twenty-first Day of July, 1998

*Attest:*

BRUCE LEHMAN

*Attesting Officer*     *Commissioner of Patents and Trademarks*